(12) United States Patent
Wang et al.

(10) Patent No.: US 11,049,774 B2
(45) Date of Patent: Jun. 29, 2021

(54) HYBRID SOURCE DRAIN REGIONS FORMED BASED ON SAME FIN AND METHODS FORMING SAME

(71) Applicant: Taiwan Semiconductor Manufacturing Company, Ltd., Hsinchu (TW)

(72) Inventors: Pei-Hsun Wang, Kaohsiung (TW); Shih-Cheng Chen, New Taipei (TW); Chun-Hsiung Lin, Zhubei (TW); Chih-Hao Wang, Baoshan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/515,484

(22) Filed: Jul. 18, 2019

(65) Prior Publication Data
US 2021/0020524 A1   Jan. 21, 2021

(51) Int. Cl.
| H01L 21/70 | (2006.01) |
| H01L 21/8238 | (2006.01) |
| H01L 27/092 | (2006.01) |
| H01L 21/306 | (2006.01) |
| H01L 21/3065 | (2006.01) |

(52) U.S. Cl.
CPC ........ *H01L 21/823821* (2013.01); *H01L 21/823814* (2013.01); *H01L 27/0924* (2013.01); *H01L 21/3065* (2013.01); *H01L 21/30604* (2013.01)

(58) Field of Classification Search
CPC ..... H01L 21/823821; H01L 21/823814; H01L 27/0924; H01L 21/30604; H01L 21/3065
See application file for complete search history.

(56) References Cited

U.S. PATENT DOCUMENTS

| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,418,897 B1 | 8/2016 | Ching et al. |
| 9,520,482 B1 | 12/2016 | Chang et al. |

(Continued)

FOREIGN PATENT DOCUMENTS

| CN | 105977299 A | 9/2016 |
| KR | 20160137962 A | 12/2016 |

*Primary Examiner* — Victor A Mandala
*Assistant Examiner* — Colleen E Snow
(74) *Attorney, Agent, or Firm* — Slater Matsil, LLP

(57) ABSTRACT

A method includes forming an epitaxy semiconductor layer over a semiconductor substrate, and etching the epitaxy semiconductor layer and the semiconductor substrate to form a semiconductor strip, which includes an upper portion acting as a mandrel, and a lower portion under the mandrel. The upper portion is a remaining portion of the epitaxy semiconductor layer, and the lower portion is a remaining portion of the semiconductor substrate. The method further includes growing a first semiconductor fin starting from a first sidewall of the mandrel, growing a second semiconductor fin starting from a second sidewall of the mandrel. The first sidewall and the second sidewall are opposite sidewalls of the mandrel. A first transistor is formed based on the first semiconductor fin. A second transistor is formed based on the second semiconductor fin.

20 Claims, 41 Drawing Sheets

Y-cut at metal gate

(56) References Cited

U.S. PATENT DOCUMENTS

| | | |
|---|---|---|
| 9,576,814 B2 | 2/2017 | Wu et al. |
| 9,608,116 B2 | 3/2017 | Ching et al. |
| 9,812,363 B1 | 11/2017 | Liao et al. |
| 9,859,380 B2 | 1/2018 | Lee et al. |
| 10,461,177 B2 | 10/2019 | Liao et al. |
| 2008/0157130 A1 | 7/2008 | Chang |
| 2013/0141963 A1 | 6/2013 | Liaw |
| 2014/0170998 A1 | 6/2014 | Then et al. |
| 2015/0214340 A1* | 7/2015 | Maeda ................ H01L 29/785 438/283 |
| 2016/0372383 A1* | 12/2016 | Basker ................ H01L 29/456 |
| 2018/0158841 A1 | 6/2018 | Glass et al. |
| 2019/0131413 A1 | 5/2019 | Vellianitis et al. |
| 2019/0165144 A1 | 5/2019 | Chen et al. |
| 2019/0267466 A1 | 8/2019 | Zhu |

* cited by examiner

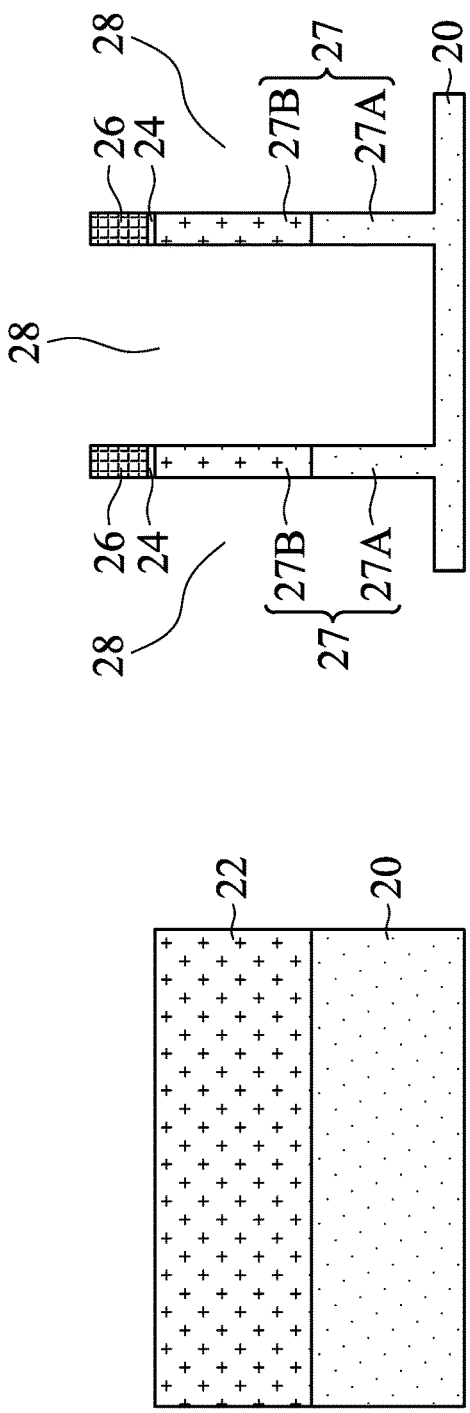

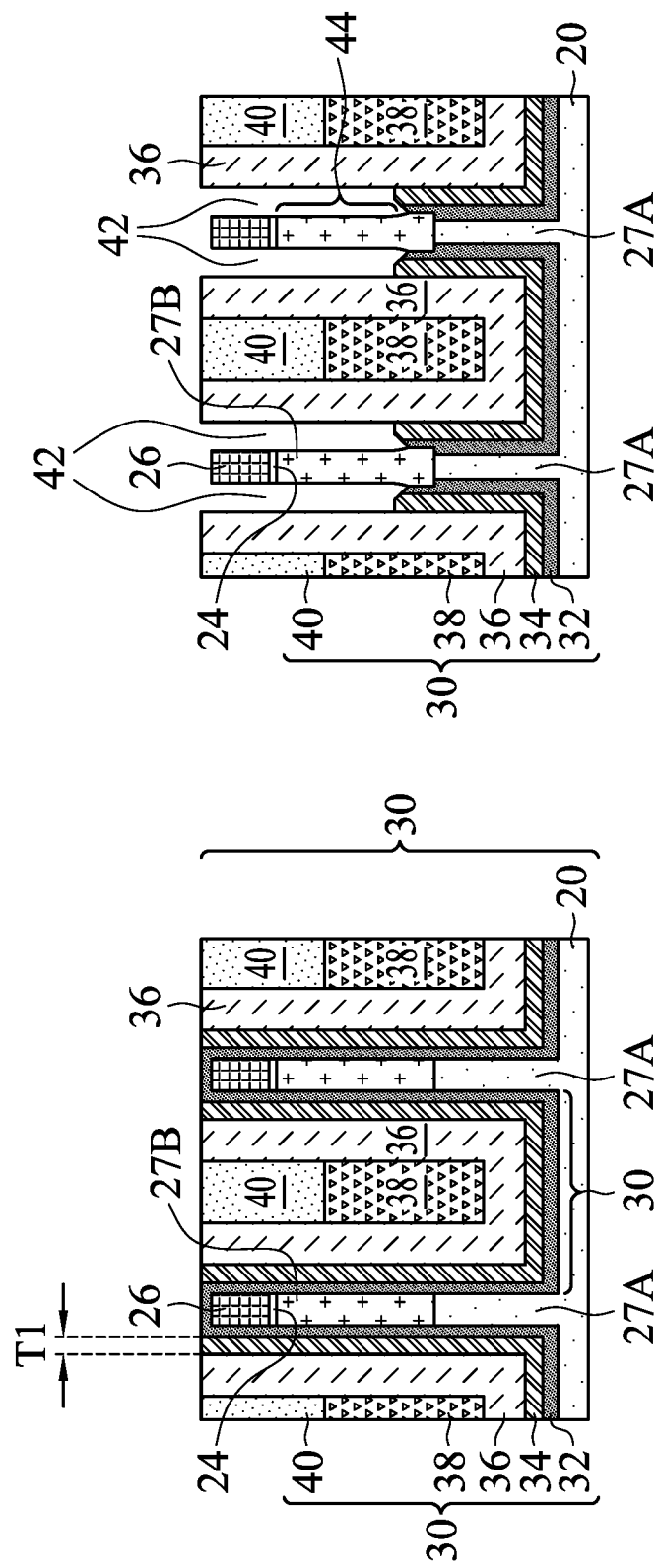

X-cut at channel

X-cut at mandrel (SiGe) Fin

X-cut at mandrel (SiGe) Fin      X-cut at channel

Y-cut at dummy gate

Y-cut at S/D

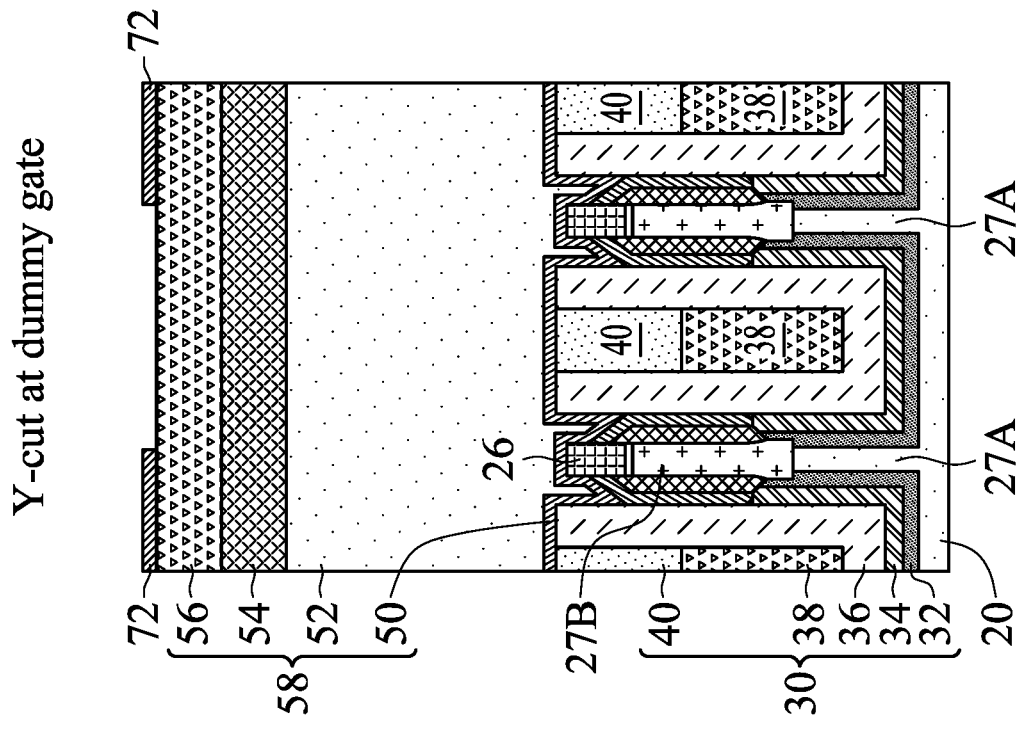
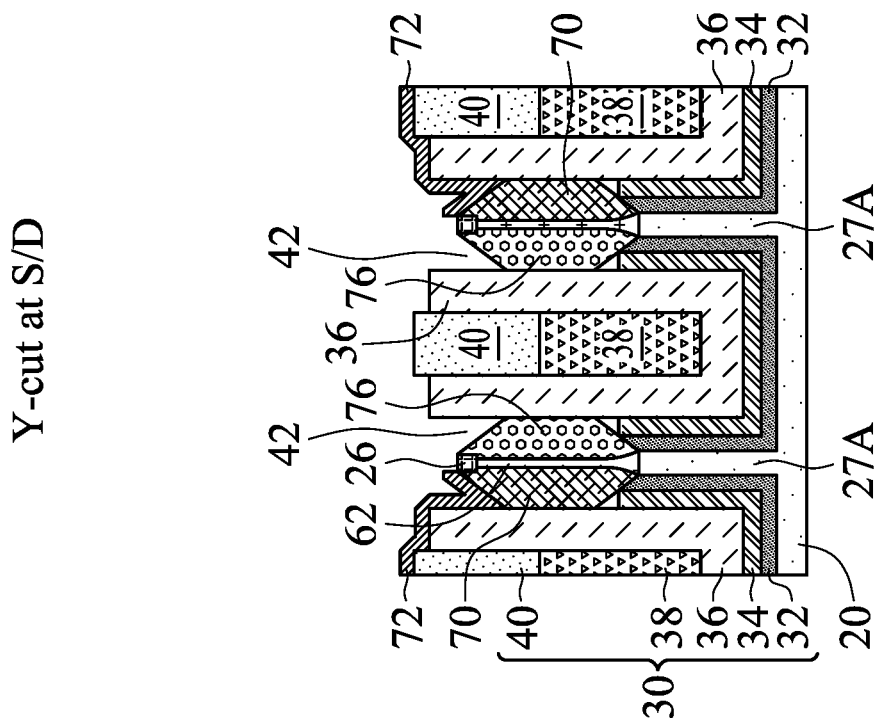

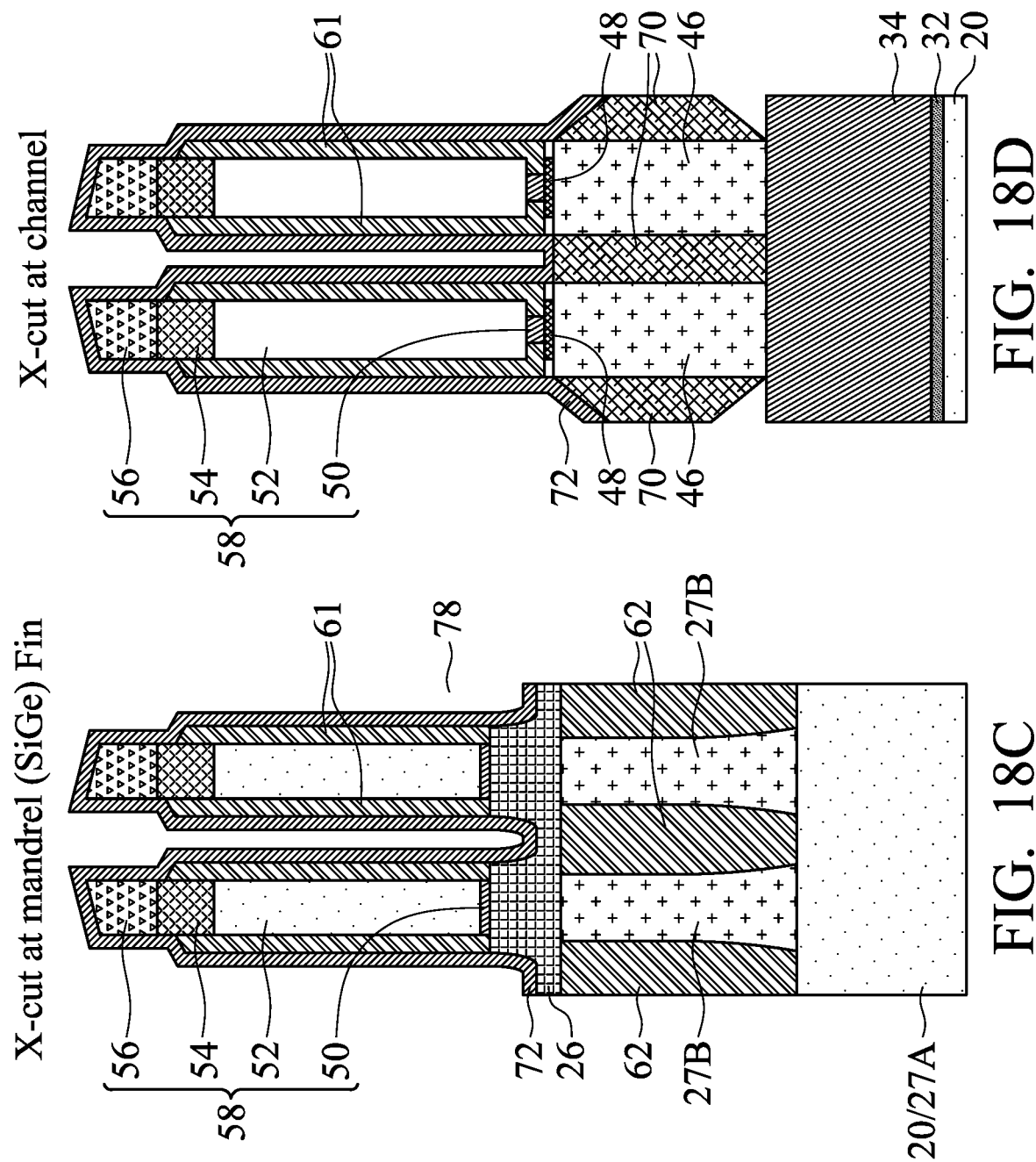

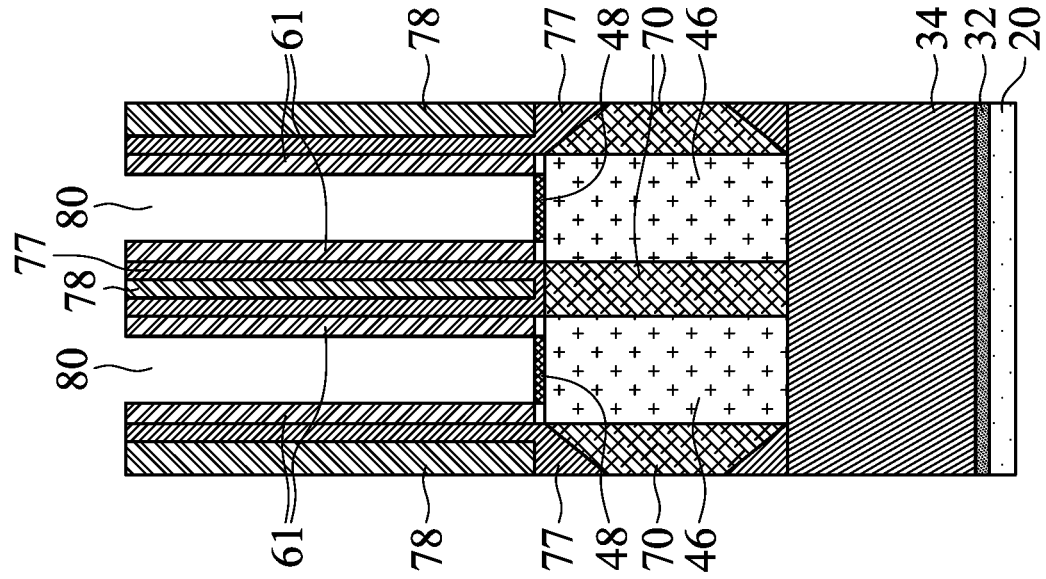
FIG. 19D X-cut at channel
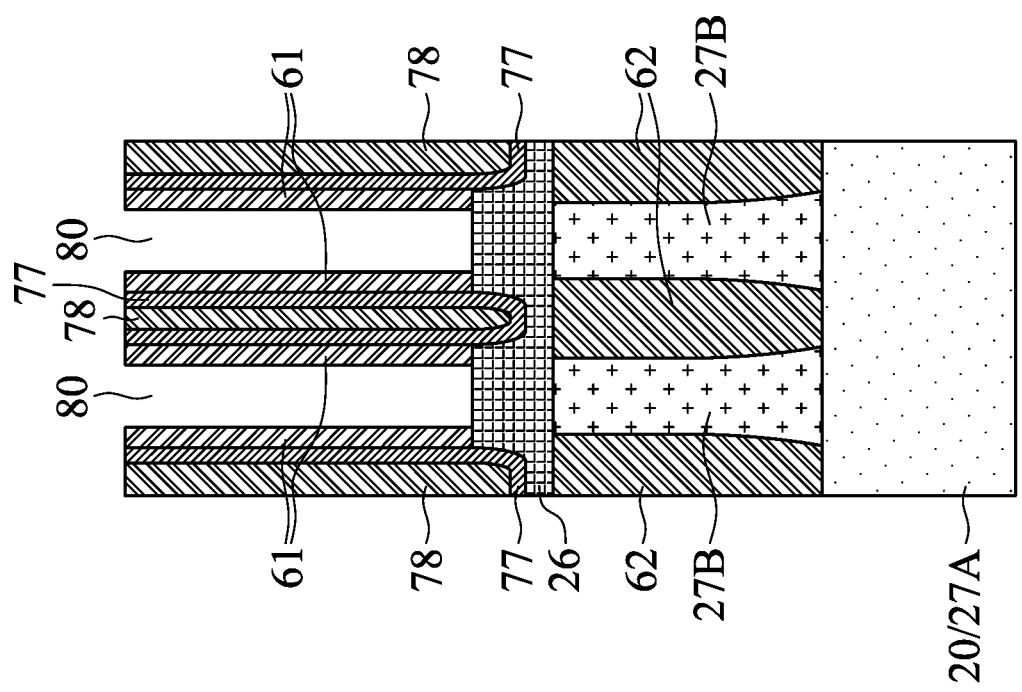
FIG. 19C X-cut at mandrel (SiGe) Fin

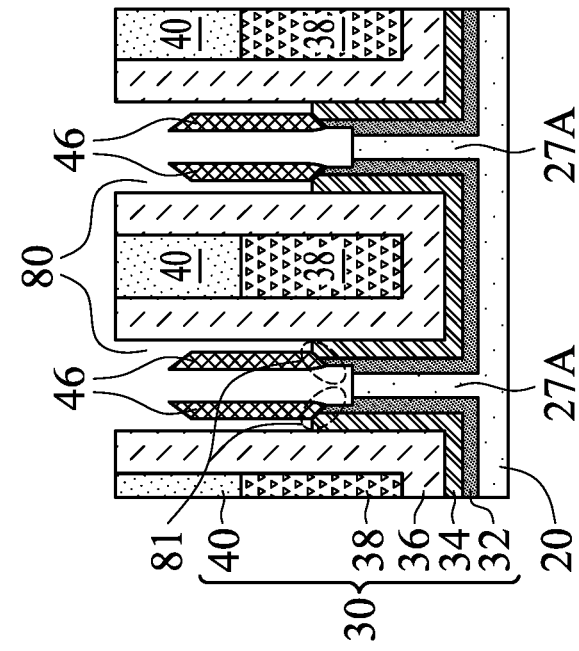
FIG. 20B Y-cut at dummy gate
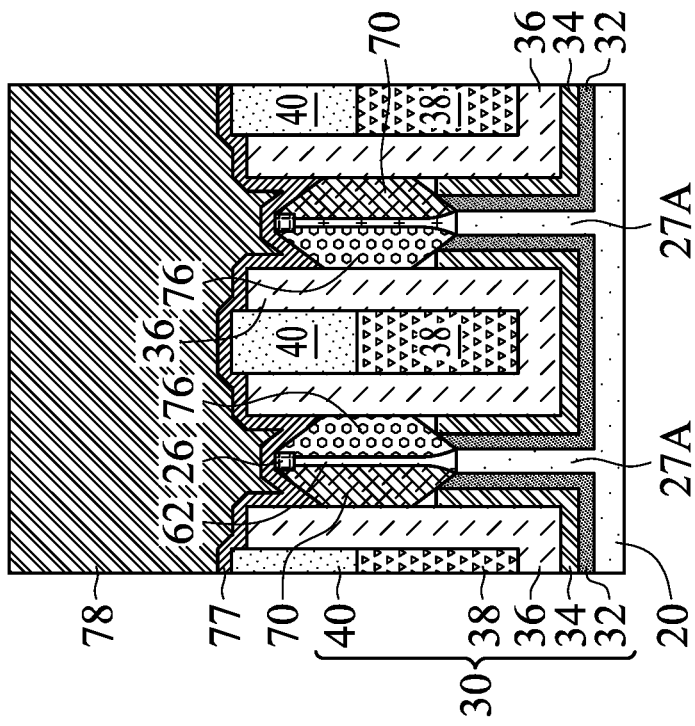
FIG. 20A Y-cut at S/D

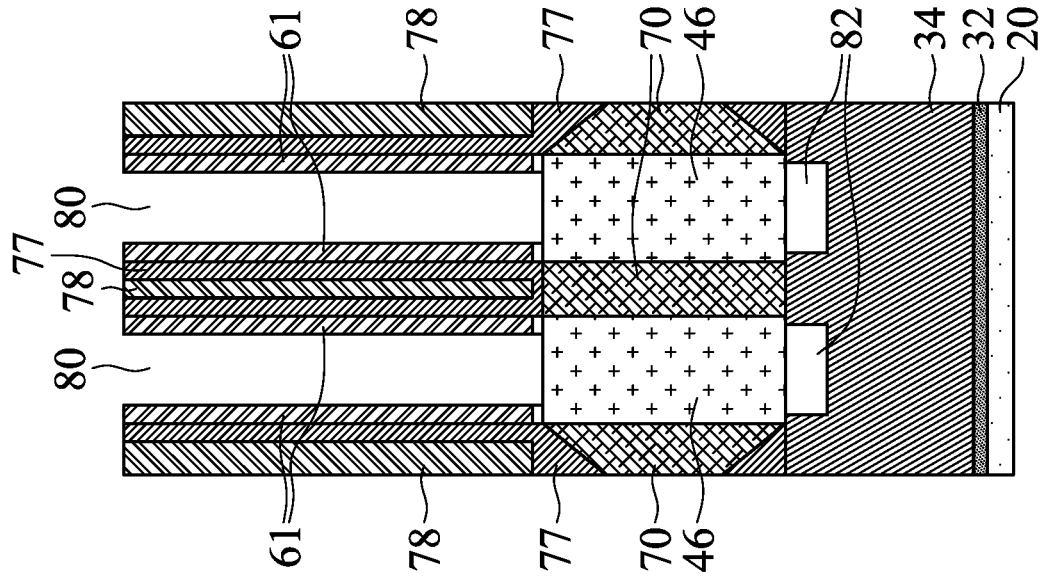
FIG. 20D  X-cut at channel
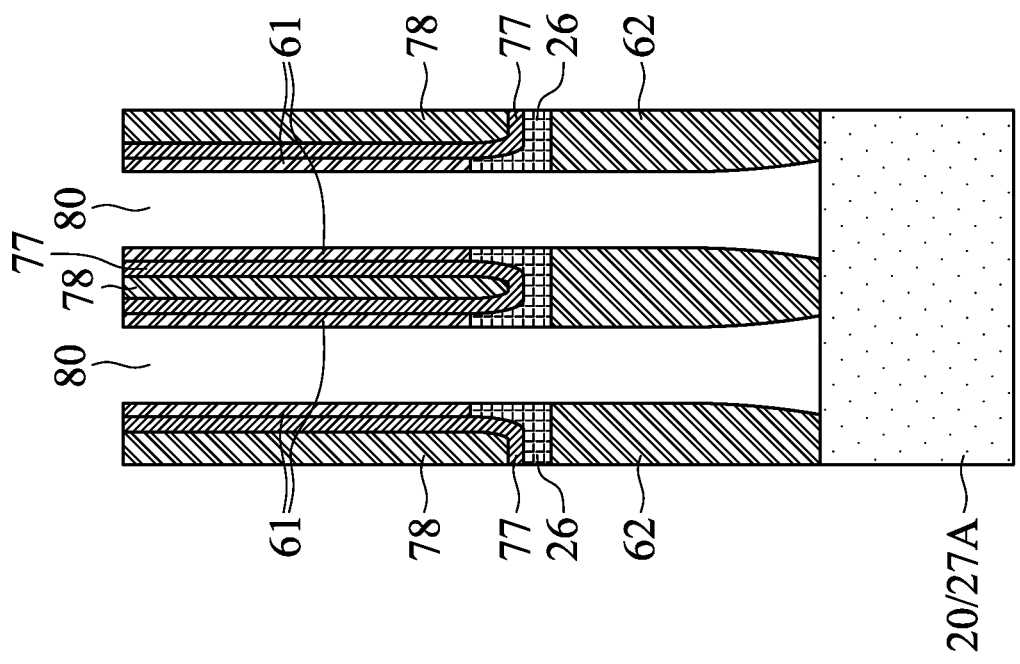
FIG. 20C  X-cut at mandrel (SiGe) Fin

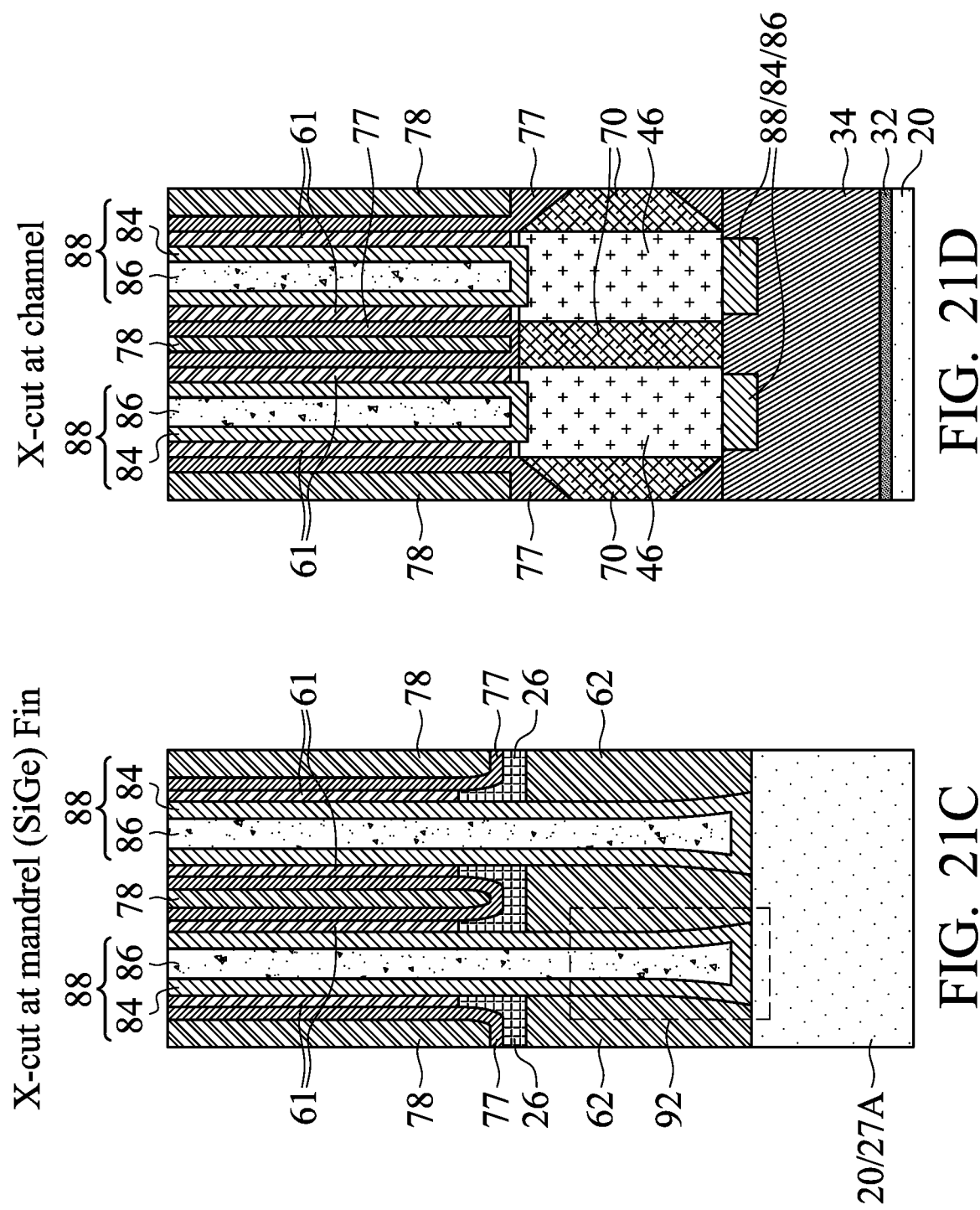

US 11,049,774 B2

HYBRID SOURCE DRAIN REGIONS FORMED BASED ON SAME FIN AND METHODS FORMING SAME

BACKGROUND

With the increasing down-scaling of integrated circuits and increasingly demanding requirements to the speed of integrated circuits, transistors need to have higher drive currents with increasingly smaller dimensions. Fin Field-Effect Transistors (FinFETs) were thus developed. In conventional FinFET formation processes, the semiconductor fins may be formed by forming trenches in a silicon substrate, filling the trenches with dielectric materials to form Shallow Trench Isolation (STI) regions, and then recessing the top portions of the STI regions. The silicon substrate portions between the recessed portions of the STI regions thus form semiconductor fins, on which the FinFETs are formed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-5, 6A, 6B, 7A, 7B, 7C, 7D, 8A, 8B, 8C, 8D, 9A, 9B, 9C, 9D, 10A, 10B, 10C, 10D, 11A, 11B, 11C, 11D, 12A, 12B, 12C, 12D, 12E, 13A, 13B, 13C, 13D, 14A, 14B, 14C, 14D, 15A, 15B, 15C, 15D, 16A, 16B, 16C, 16D, 16E, 17A, 17B, 17C, 17D, 18A, 18B,18C,18D, 19A, 19B, 19C, 19D, 20A, 20B, 20C, 20D, 21A, 21B, 21C, 21D, 22, and 23 illustrate the cross-sectional views and a top view of intermediate stages in the formation of Fin Field-Effect Transistors (FinFETs) in accordance with some embodiments.

DETAILED DESCRIPTION

Figure 5:
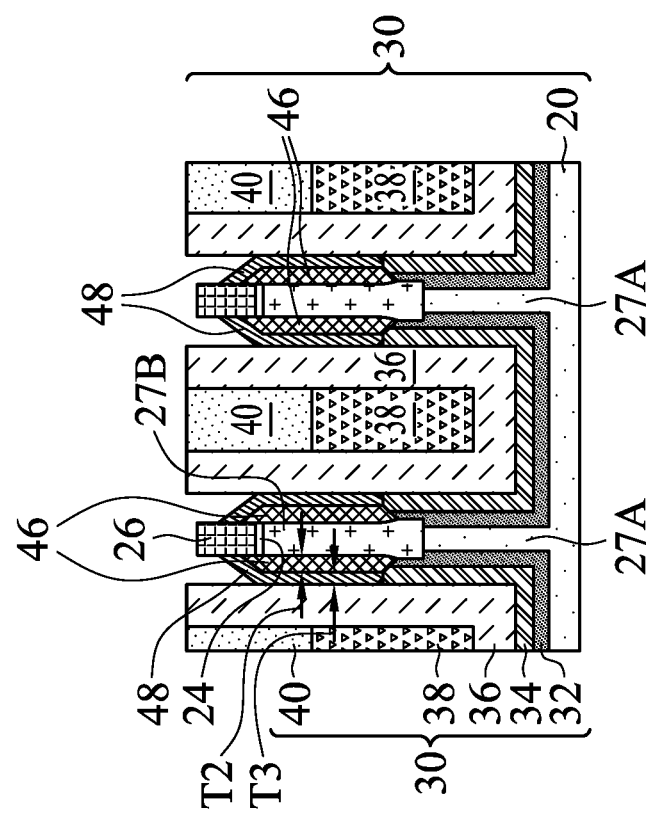

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and/or Gate-All-Around (GAA) transistors with high densities and the method of forming the same are provided in accordance with some embodiments. The intermediate stages in the formation of the FinFETs are illustrated in accordance with some embodiments. Some variations of some embodiments are discussed. Throughout the various views and illustrative embodiments, like reference numbers are used to designate like elements. In accordance with some embodiments of the present disclosure, a semiconductor fin is formed as a mandrel, and two semiconductor fins are grown on opposite sides of the mandrel. Multi-gate transistors (such as FinFETs or GAA transistors) are formed based on the two semiconductor fins. The mandrel is oxidized to form a dielectric fin, which electrically isolates the source/drain regions of the two transistors from each other. Although method embodiments may be discussed as being performed in a particular order, other method embodiments may be performed in any logical order.

Figure 24:
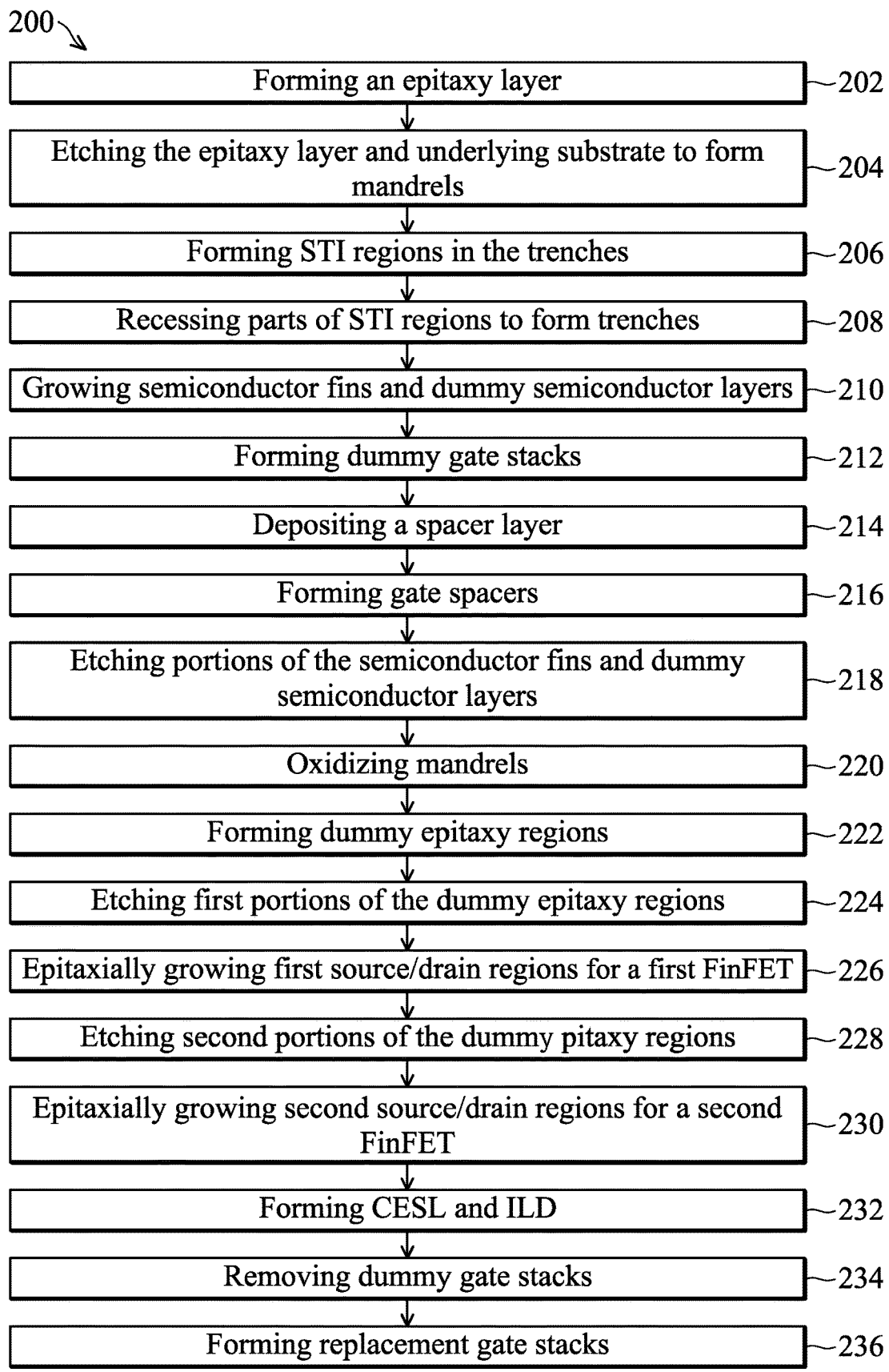
FIG. 24 illustrates a process flow for forming FinFETs in accordance with some embodiments.

The cross-sectional views and a top view of intermediate stages in the formation of the multi-gate transistors are illustrated in accordance with some embodiments of the present disclosure. The corresponding processes are also reflected schematically in the process flow shown in FIG. 24.

In FIG. 1, substrate 20 (which is a part of a wafer) is provided. The substrate 20 may be a semiconductor substrate, such as a bulk semiconductor substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Semiconductor layer 22 is epitaxially grown on semiconductor substrate 20. The respective process is illustrated as process 202 in the process flow 200 shown in FIG. 24. Semiconductor layer 22 is formed of a material different from that of semiconductor substrate 20. In accordance with some embodiments of the present disclosure, semiconductor layer 22 comprises germanium, and may include silicon germanium or germanium (without silicon). The germanium atomic percentage may be higher than about 20 percent, and may be in the range between about 20 percent and wo percent. When semiconductor substrate 20 is formed of silicon or silicon germanium, the difference in the germanium atomic percentages in semiconductor layer 22 and semiconductor substrate 20 is higher than about 20.

Referring to FIG. 2, patterned pad layer 24 and mask layer 26 are formed on semiconductor layer 22 to act as etching masks. Pad layer 24 and mask layer 26 may be formed as blanket layers, which are then patterned. To pattern pad layer 24 and mask layer 26, a patterned photo resist (not shown) is formed on the blanket mask layer 26, and mask layer 26 and pad layer 24 are etched using the patterned photo resist as an etching mask or conventional double pattering method is used with mandrel define. Pad layer 24 may be a thin film including silicon oxide. Pad layer 24 may act as an etch stop layer for etching mask layer 26. In accordance with some embodiments of the present disclosure, mask layer 26 is formed of silicon nitride, silicon carbo-nitride, or the like, and may be formed using, for example, Low-Pressure Chemical Vapor Deposition (LPCVD), thermal nitridation of silicon, Plasma Enhanced Chemical Vapor Deposition (PECVD), or the like. Mask layer 26 is used as a hard mask during subsequent photolithography processes.

Next, semiconductor layer 22 and semiconductor substrate 20 are etched using mask layer 26 as an etching mask, forming trenches 28 and mandrels 27B. The respective process is illustrated as process 204 in the process flow 200 shown in FIG. 24. Trenches 28 penetrate through semiconductor layer 22 and extend into semiconductor substrate 20. The portions of semiconductor substrate 20 and semiconductor layer 22 between trenches 28 are referred to as hybrid semiconductor strips 27. Also, the portions of semiconductor layer 22 in hybrid semiconductor strips 27 are referred to as mandrels 27B. Hybrid semiconductor strips 27 also include portions 27A, which are the remaining portions of the etched semiconductor substrate 20. The portion of semiconductor substrate 20 underlying hybrid semiconductor strips 27 is referred to as a bulk semiconductor substrate hereinafter. In subsequent paragraphs, mandrels 27B may also be referred to as SiGe mandrels 27B, although mandrels 27B may be formed of other materials other than silicon germanium.

Trenches 28 are then filled with dielectric materials, forming isolation regions 30, which are shown in FIG. 3. The respective process is illustrated as process 206 in the process flow 200 shown in FIG. 24. Throughout the description, isolation regions 30 are also referred to as Shallow Trench Isolation (STI) regions 30. In accordance with some embodiments, STI regions 30 include dielectric liner 32, dielectric layers 34, 36, and 38, and dielectric caps 40 overlapping the respective dielectric layers 38. In accordance with some embodiments, dielectric liners 32 are formed of silicon nitride, silicon carbo-nitride, or the like. The formation method may include thermal oxidation or a conformal deposition method such as Chemical Vapor Deposition (CVD), Atomic Layer Deposition (ALD), or the like. Dielectric layers 34 may be formed of an oxide such as silicon oxide, silicon oxy-carbide, silicon oxy-carbo-nitride, or the like. The thickness T1 of dielectric layer 34 may be in the range between about 10 nm and about 20 nm.

Dielectric layer 36 may be formed of silicon carbo-nitride, silicon oxy-carbide, silicon oxy-carbo-nitride, or the like. The material of dielectric layers 34 and 36 may be different from each other. In accordance with some embodiments, the thickness of dielectric layer 36 is in the range between about 10 nm and about 20 nm. Dielectric layers 34 and 36 may be formed using conformal deposition methods such as CVD or ALD. Dielectric layers 38 may be formed of an oxide such as silicon oxide. Dielectric layer 38 may be formed using a conformal deposition method such as ALD or CVD, or a bottom-up deposition method such as Flowable Chemical Vapor Deposition (FCVD), spin-on coating, or the like. Dielectric cap 40 is formed over dielectric layer 38, and may be formed of a high-k dielectric material, which may be a metal oxide such as hafnium oxide, lanthanum oxide, or the like. Other dielectric materials such as silicon oxy-carbide, silicon oxy-carbo-nitride, or the like may be formed. The material of dielectric layer 36 and dielectric cap 40 are different from the material of dielectric layer 34 and dielectric liner 32. Dielectric cap 40 may be formed by performing a planarization process such as a Chemical Mechanical Polish (CMP) process or a mechanical grinding process after the formation of dielectric layer 38, recessing dielectric layer 38, and then filling the recess left by the recessed dielectric layer 38 with a dielectric material, followed by another planarization process.

Referring to FIG. 4, dielectric layer 34 and dielectric liner 32 are recessed, forming trenches 42. The respective process is illustrated as process 208 in the process flow 200 shown in FIG. 24. The top portions of mandrels 27B protrude higher than the top surface of the recessed dielectric liner 32 and dielectric layer 34 to form dummy semiconductor fins 44, which are used as templates for epitaxially growing a semiconductor material. The bottoms of dummy semiconductor fins 44 may be higher than the bottoms of mandrels 27B. In accordance with some embodiments, the etching of dielectric liner 32 and dielectric layer 34 is performed using a fluorine-based chemical such as $CF_4$, $NF_3$, $SF_6$, or the like. Oxygen ($O_2$) may be added as a part of the etching gas. The etching process may be isotropic, and may be performed using dry etching (for example, with fluorine-based radicals generated) or wet etching. The sidewalls of dielectric layers 36 and dummy semiconductor fins 44 are exposed to trenches 42. Dielectric layer 36, dielectric cap 40, and hard mask layer 26 are not etched.

FIG. 5 illustrates the formation of semiconductor fins 46 and dummy semiconductor layers 48, which are formed through epitaxy. The respective process is illustrated as process 210 in the process flow 200 shown in FIG. 24. Semiconductor fins 46 are epitaxially grown from dummy semiconductor fins 44. The material of semiconductor fins 46 is different from that of dummy semiconductor fins 44. In accordance with some embodiments of the present disclosure, semiconductor fins 46 are formed of silicon (free from germanium), silicon germanium, a III-V compound material, or the like. Semiconductor fins 46 may be substantially free from germanium, for example, with germanium percentage lower than about 5 percent. When both of the dummy semiconductor fins 44 and semiconductor fins 46 are formed of silicon germanium, the germanium atomic percentage AP46 in semiconductor fins 46 may be lower than the germanium atomic percentage AP44 in dummy semiconductor fins 44, for example, by a difference (AP44−AP46) being equal to about 20 percent or greater. The thickness T2 of semiconductor fins 46 may be in the range between about 5 nm and about 10 nm.

The formation of semiconductor fins 46 is stopped while there are still some spaces between semiconductor fins 46 and the closest dielectric layer 36. Next, dummy semiconductor layers 48 are epitaxially grown on semiconductor fins 46, and are filled into the spaces between semiconductor fins 46 and dielectric layers 36. The material of dummy semiconductor layers 48 is different from the material of semiconductor fins 46 but is similar to dummy semiconductor fins 44. For example, semiconductor fins 46 may be formed of silicon or silicon germanium, while dummy semiconductor layers 48 may be formed of silicon germanium or germanium, with the germanium atomic percentage AP48 in dummy semiconductor layers 48 being higher than the germanium atomic percentage AP46 in semiconductor fins 46, for example, by a difference (AP48−AP46) equal to about 20 percent or greater. The thickness T3 of dummy semiconductor layers 48 may be in the range between about 5 nm and about 8 nm.

Figure 6B:
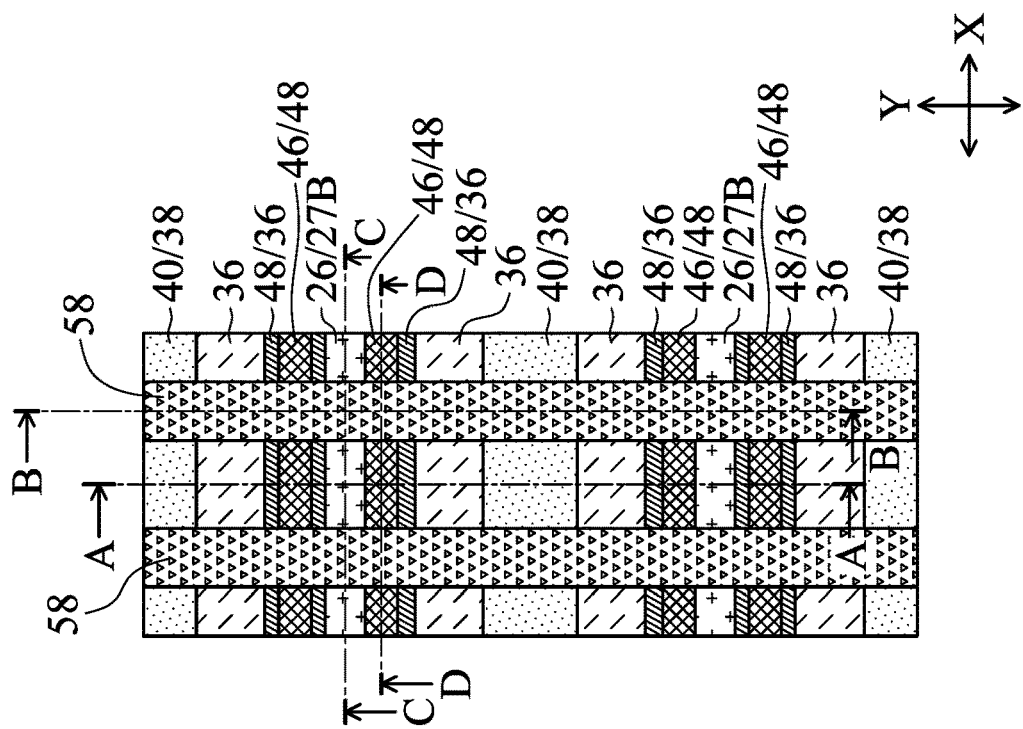
Figure 6A:
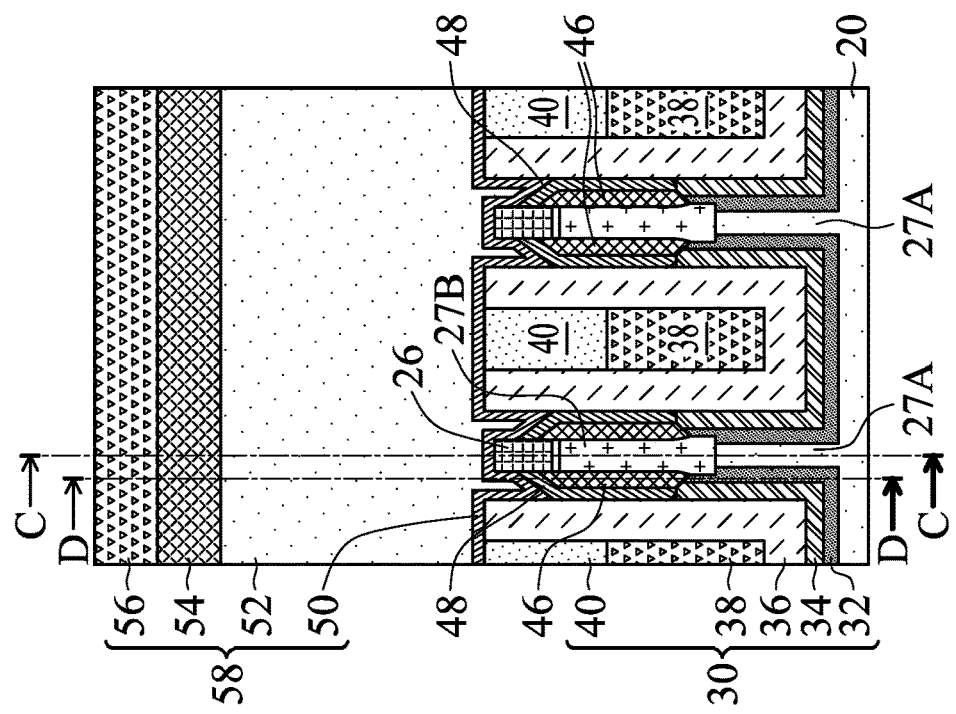

FIGS. 6A and 6B illustrate a cross-sectional view and a top view, respectively, after dummy gate stacks 58 are formed. Referring to the top view shown in FIG. 6B, dummy gate stacks 58 are formed as parallel strips on the structure shown in FIG. 5. The respective process is illustrated as process 212 in the process flow 200 shown in FIG. 24. The lengthwise direction (the illustrated Y-direction) of the elongated dummy gate stacks 58 may be perpendicular to the lengthwise direction (the illustrated X-direction) of mandrels 27B, semiconductor fins 46, and the like. Dummy gate stacks 58 may be formed by depositing a plurality of layers (50, 52, 54, and 56 in FIG. 6A) on the structure shown in FIG. 5, and patterning the plurality of layers.

As shown in FIG. 6A, dummy gate stack 58 may include dummy gate dielectric 50, dummy gate electrode 52, and hard masks 54 and 56. Dummy gate dielectric 50 may also not be formed in accordance with alternatively embodiments. Dummy gate dielectric 50 may be formed of silicon oxide, for example. Dummy gate electrode 52 may be formed of amorphous silicon, polysilicon, or the like. Hard mask 54 may be formed of silicon nitride, silicon carbonitride, or the like. Hard mask 56 may be formed of an oxide, for example, silicon oxide, or a like material. In accordance with some embodiments, hard mask 54 has a thickness in the range between about 10 nm and about 30 nm, and hard mask 56 has a thickness in the range between about 5 nm and about 8 nm.

The subsequent figures illustrate the processes for forming multi-gate transistors based on the structure shown in FIGS. 6A and 6B. In these figures, the figure numbers may include letter "A," letter "B," "letter "C," or letter "D." The letter "A" indicates that the respective figures show a cross-sectional view obtained from the reference plane same as the plane containing line A-A in FIG. 6B, wherein the respective cross-section is a Y-cut cross-section cutting through the source/drain (S/D) regions of the multi-gate transistors. The letter "B" indicates that the respective figures show a cross-sectional view obtained from the reference plane same as the plane containing line B-B in FIG. 6B, wherein the respective cross-section is a Y-cut cross-section cutting through a dummy gate stack 58. The letter "C" indicates that the respective figures show a cross-sectional view obtained from the reference plane same as the plane containing line C-C in FIG. 6B, wherein the respective cross-section is a X-cut cross-section cutting through one of the mandrels 27B. The letter "D" indicates that the respective figures show a cross-sectional view obtained from the reference plane same as the plane containing line D-D in FIG. 6B, wherein the respective cross-section is a X-cut cross-section cutting through one of the semiconductor fins 46, which is used for forming channel regions. The reference cross-sections C-C and D-D as shown in FIG. 6B are also shown in FIG. 6A.

Referring to FIGS. 7A, 7B, 7C, and 7D, spacer layer 60 is formed in a conformal deposition process. The respective process is illustrated as process 214 in the process flow 200 shown in FIG. 24. Spacer layer 60 is formed of a dielectric material, which may be a low-k dielectric material. For example, spacer layer 60 may be formed of porous SiON, a carbon-containing dielectric material, or the like. The thickness of spacer layer 60 may be in the range between about 5 nm and 8 nm. The formation methods may include ALD, CVD, or the like.

Next, spacer 60 is etched in an anisotropic etching process, which may be performed through a dry etching process. The horizontal portions of spacer layer 60 are removed, and some vertical portions of spacer layer 60 are left on the sidewalls of dummy gate stack 58 to form gate spacers 61, as shown in FIGS. 8C and 8D. The respective process is illustrated as process 216 in the process flow 200 shown in FIG. 24. The horizontal portions as shown in FIGS. 7A and 7B are removed, as show in FIGS. 8A and 8B.

Figure 7B:
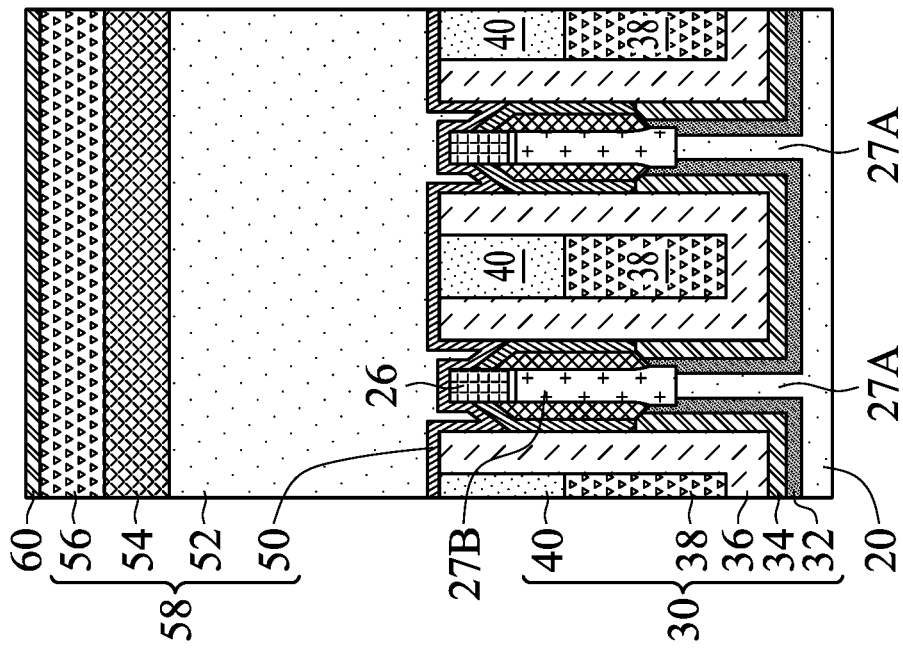
Figure 7A:
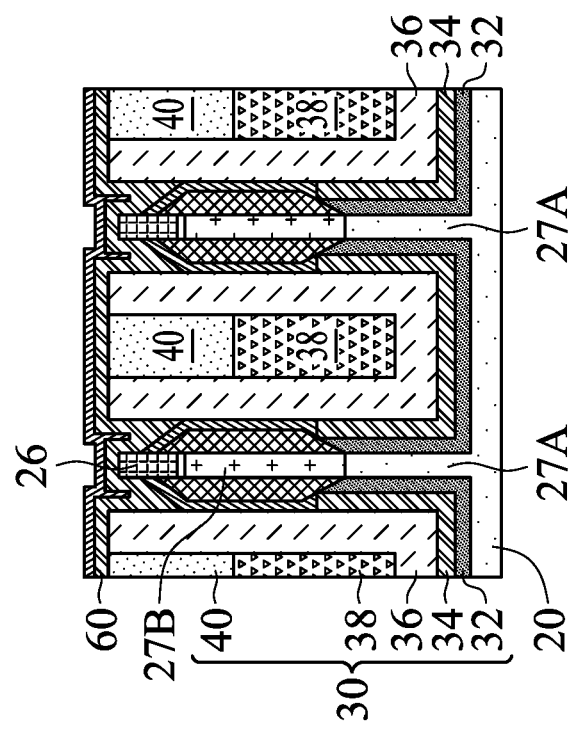
Figures 7C, 7D:
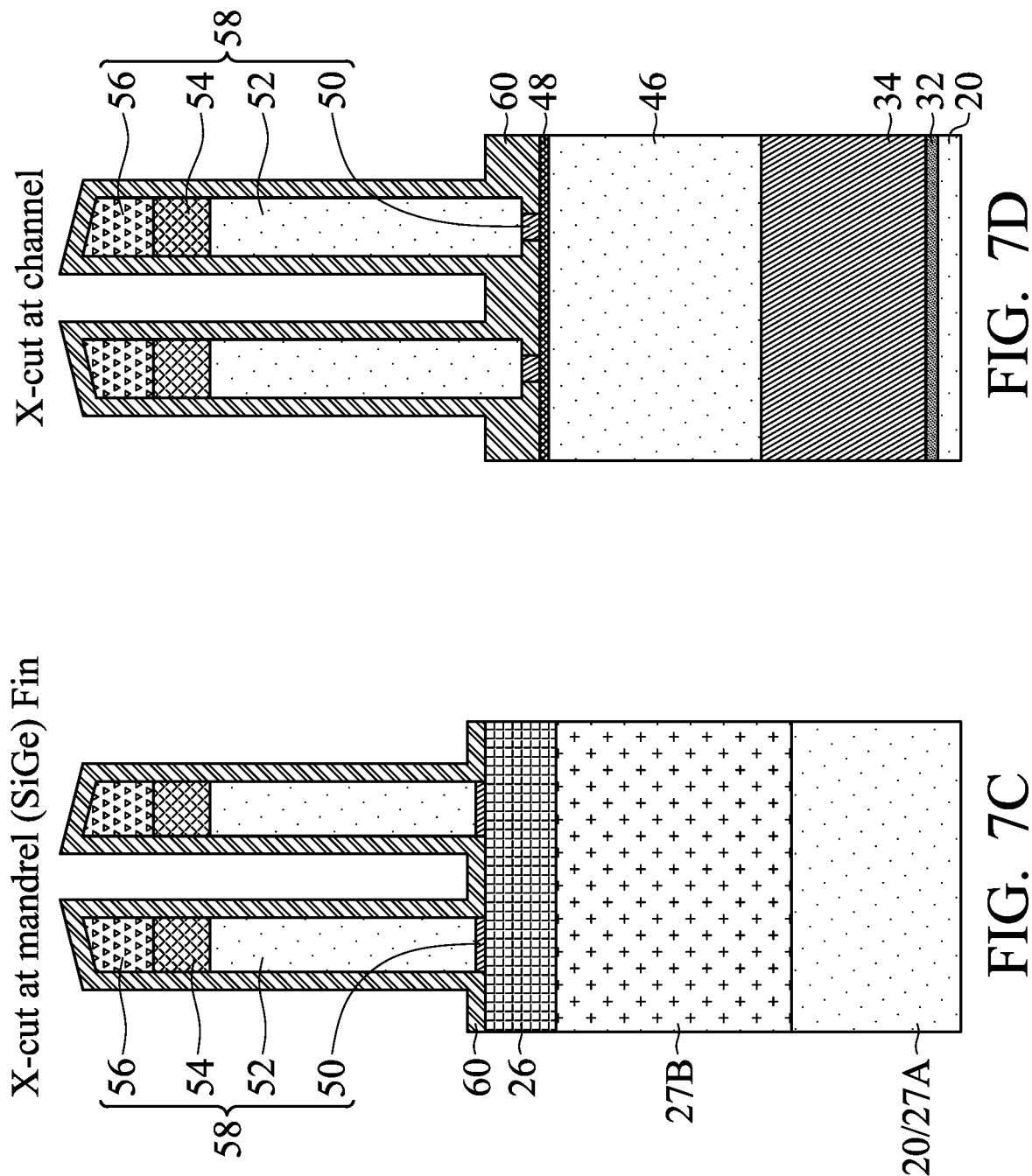
Figure 8B:
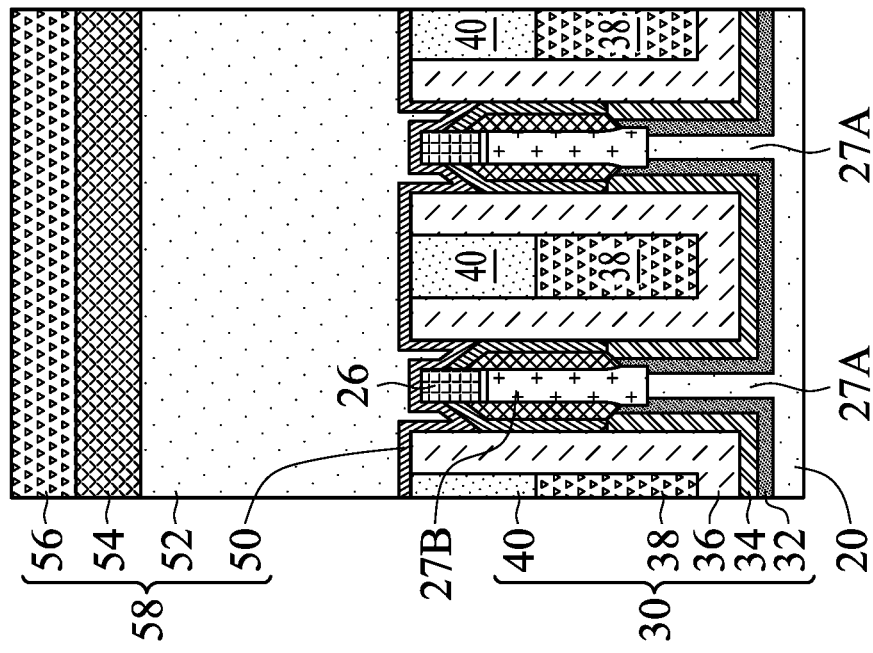
Figure 8A:
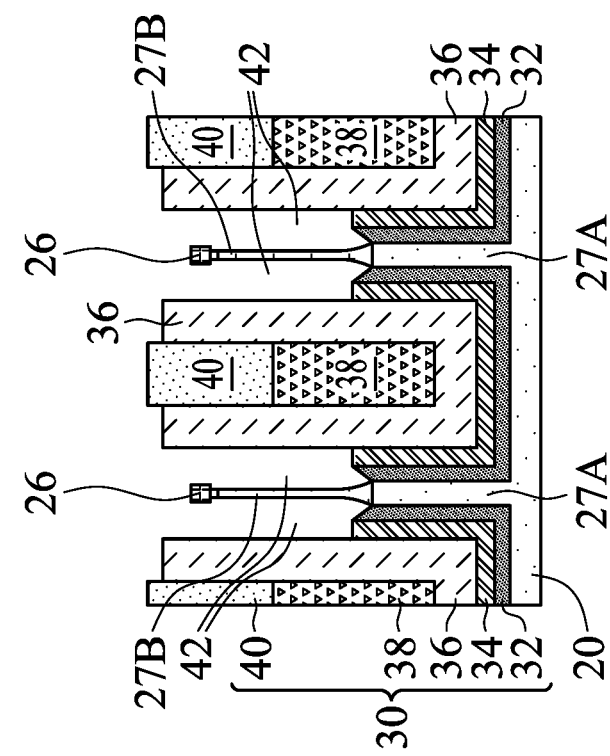
Figure 8C:
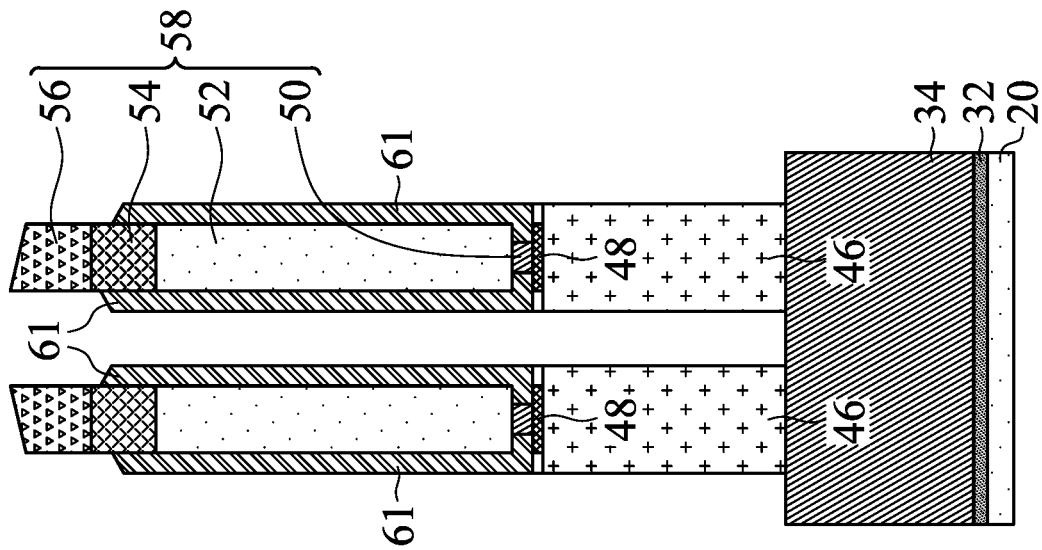
Figure 8D:
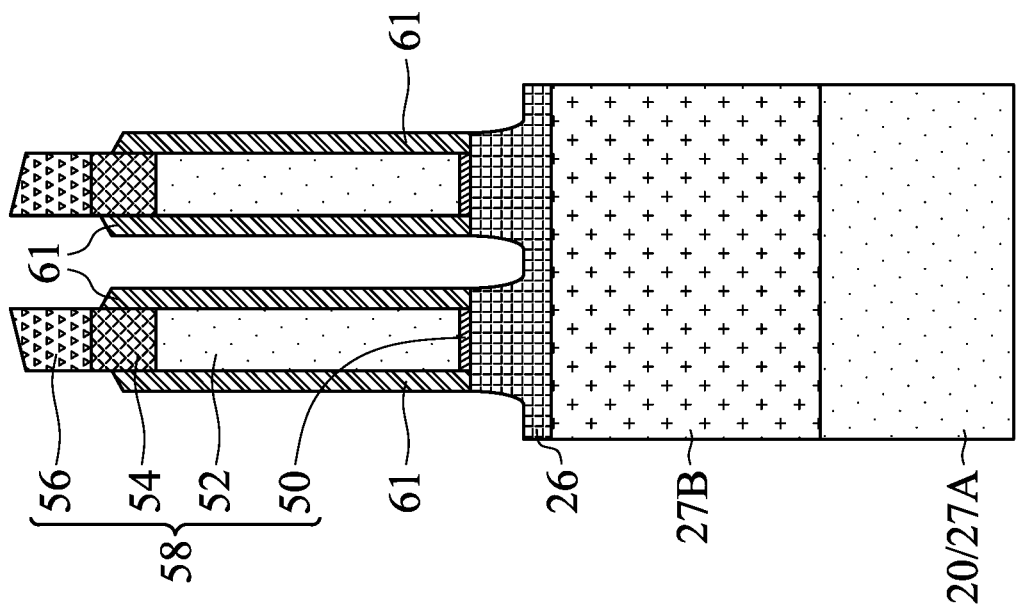
Figure 9B:
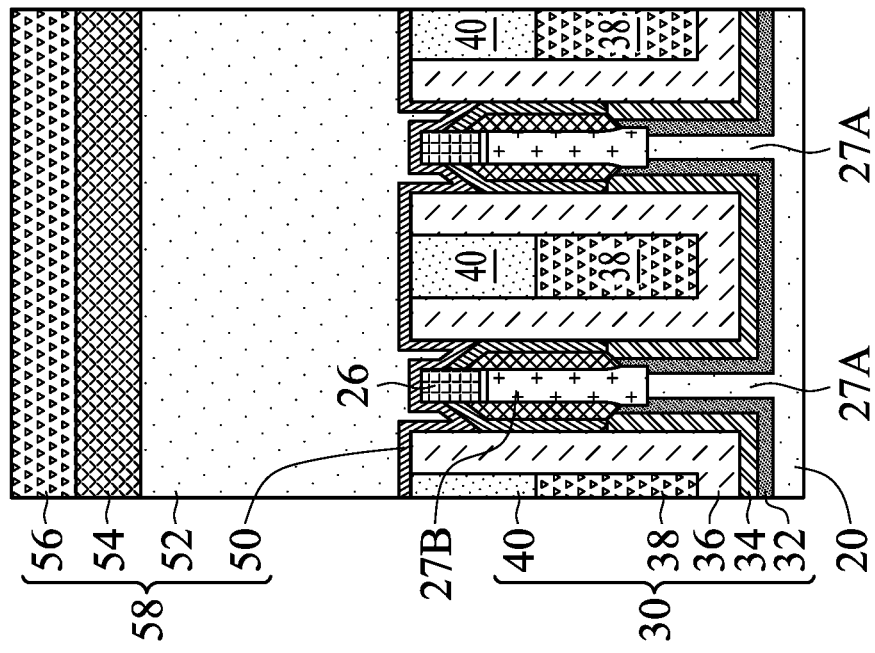
Figure 9A:
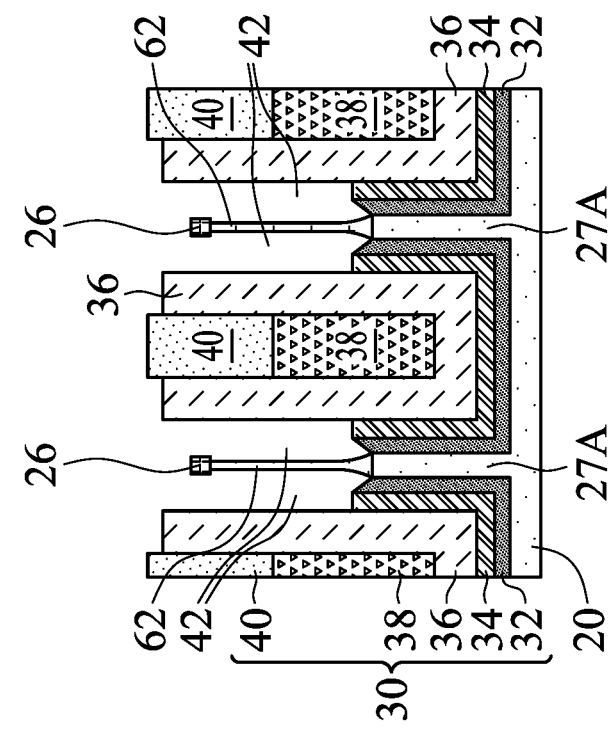

After the removal of the horizontal portions of spacer 60 as shown in FIGS. 7A and 7B, the underlying dummy semiconductor layers 48 are revealed. Etching processes are then performed to remove the exposed portions of dummy semiconductor layers 48 and semiconductor fins 46. The resulting structure is shown in FIGS. 9A, 9B, 9C, and 9D. The respective process is illustrated as process 218 in the process flow 200 shown in FIG. 24. In the etching process, the portions of dummy semiconductor layers 48 and semiconductor fins 46 are etched from the future source/drain regions (as shown in FIG. 9A), while the portions of dummy semiconductor layers 48 and semiconductor fins 46 in the future channel regions are left un-etched, as shown in FIG. 9B. Dummy semiconductor layer 48 and semiconductor fin 46 may be etched in a common etching process. The etchant may include $O_2$ and the mixture of HBr and $Cl_2$. The etching may be anisotropic (for example, using a dry etching process) to ensure that the portions of dummy semiconductor layers 48 and semiconductor fins 46 directly underlying dummy gate stacks 58 (FIG. 8B) are not removed. The etchant of semiconductor fins 46 is selected so that hard mask 26 is not etched, and thus mandrels 27B are not etched. Mandrels 27B are revealed to the re-developed trenches 42.

Figure 9C:
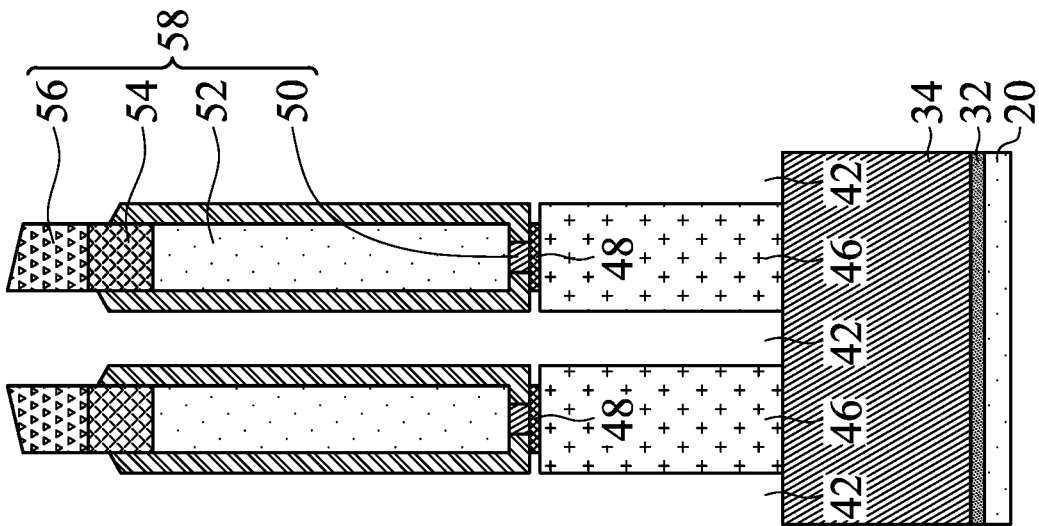
Figure 9D:
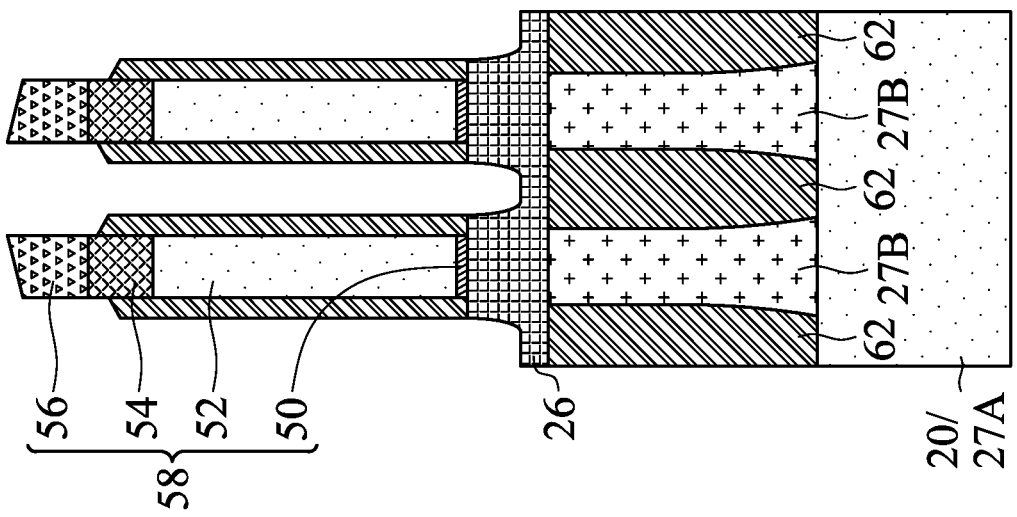

FIG. 9D illustrates that semiconductor fins 46 are recessed in the etching of dummy semiconductor layers 48 and semiconductor fins 46, wherein dummy gate stacks 58 and gate spacers 61 protect the underlying portions of dummy semiconductor layers 48 and semiconductor fins 46, so that dummy semiconductor layers 48 and semiconductor fins 46 are patterned to form the future channel regions.

Next, an oxidation process is performed, for example, using oxygen ($O_2$), ozone ($O_3$), water steam ($H_2O$), or the like. Mandrels 27B (FIGS. 8A and 8C), when formed of silicon germanium, are oxidized and converted into dielectric fins 62 (oxide fins), as shown in FIGS. 9A and 9C. The respective process is illustrated as process 220 in the process flow 200 shown in FIG. 24. The portions of mandrels 27B directly under dummy gate stack 58 are not oxidized, which are shown in FIGS. 9B and 9D. As shown in FIG. 9C, due to the oxidation process, the previously elongated mandrel 27B (FIG. 8C) becomes a strip including alternating mandrels 27B and oxide fins 62.

Figure 10B:
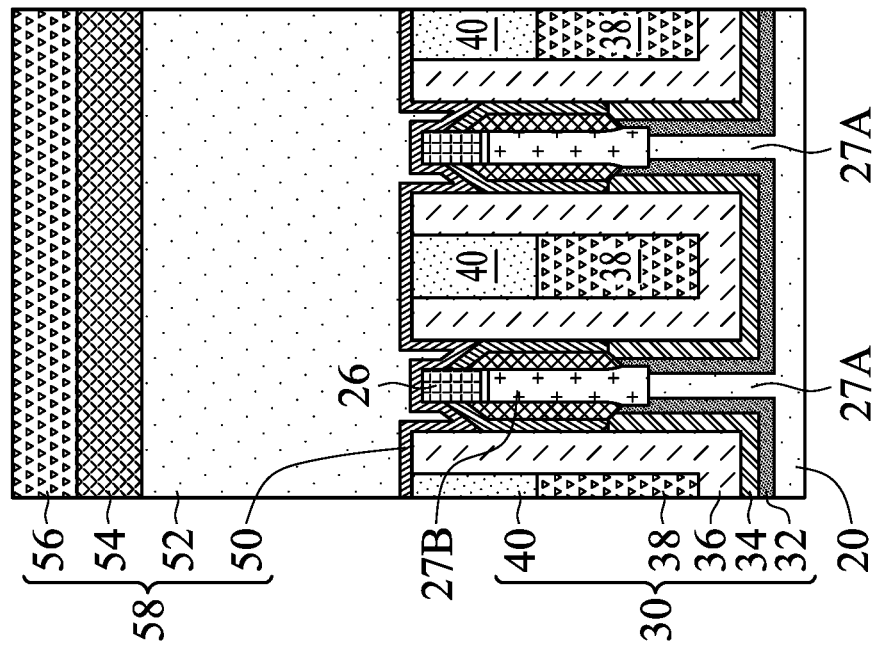
Figure 10A:
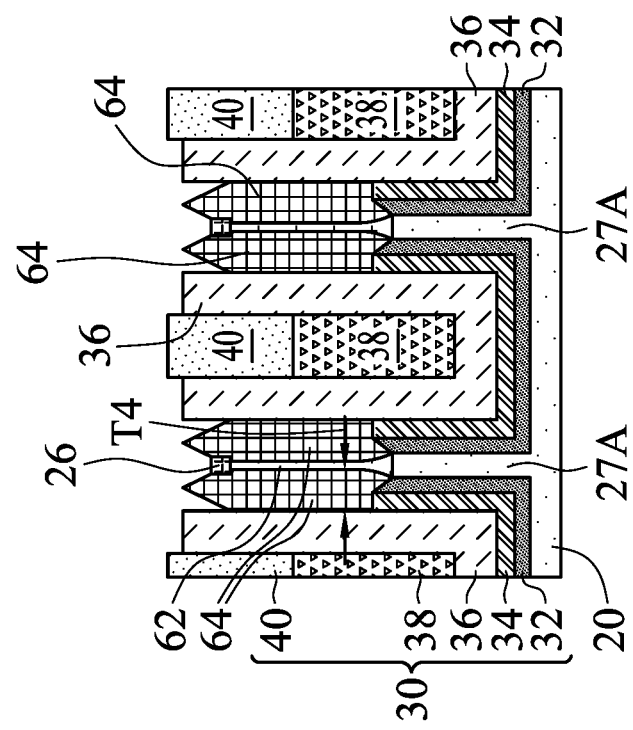
Figure 10D:
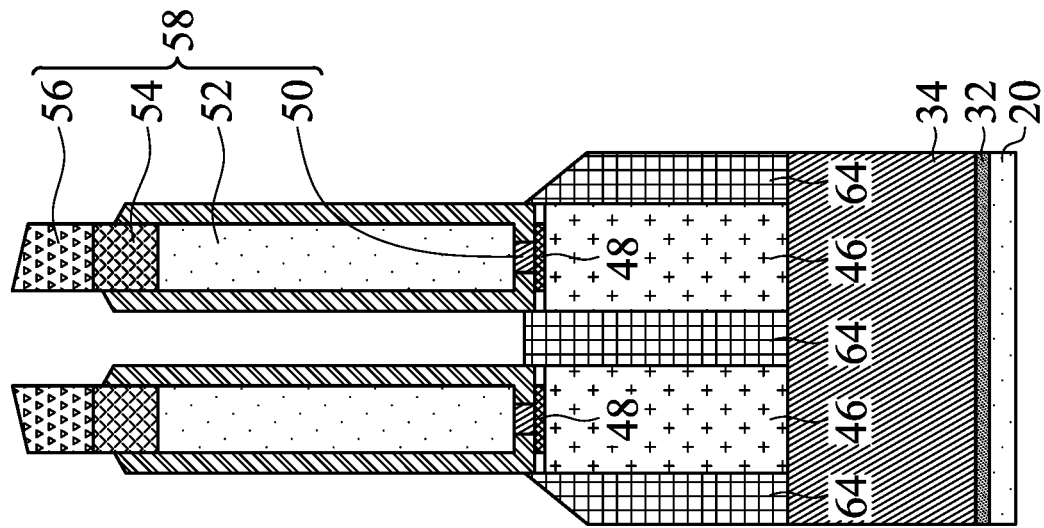
Figure 10C:
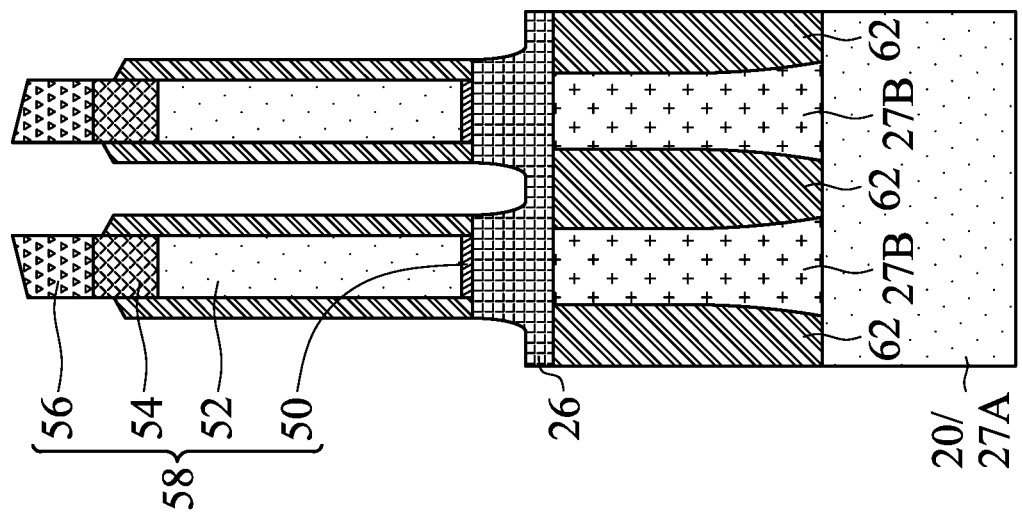
Figure 11B:
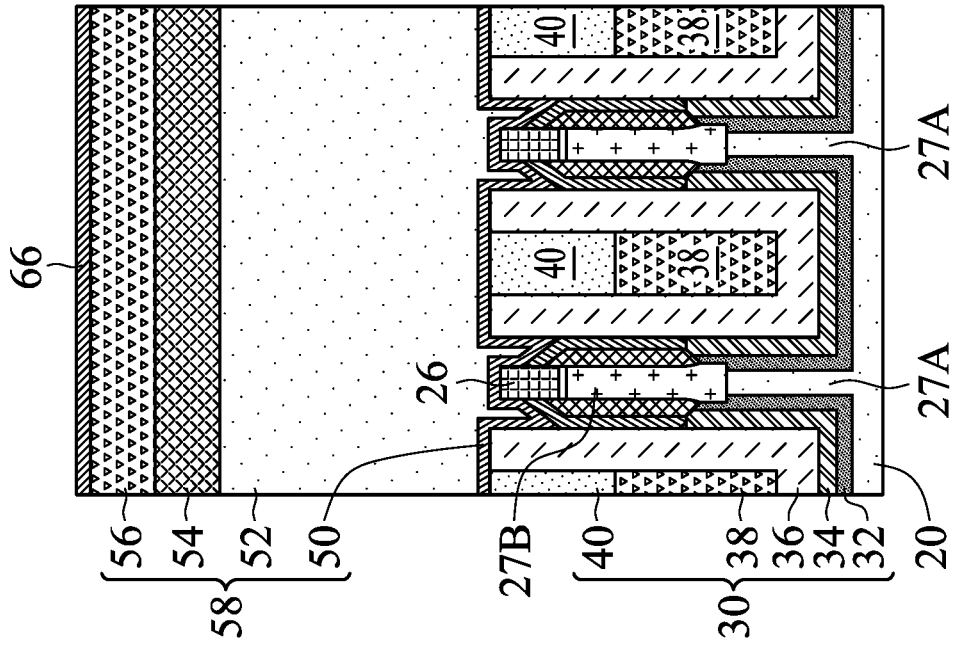
Figure 11A:
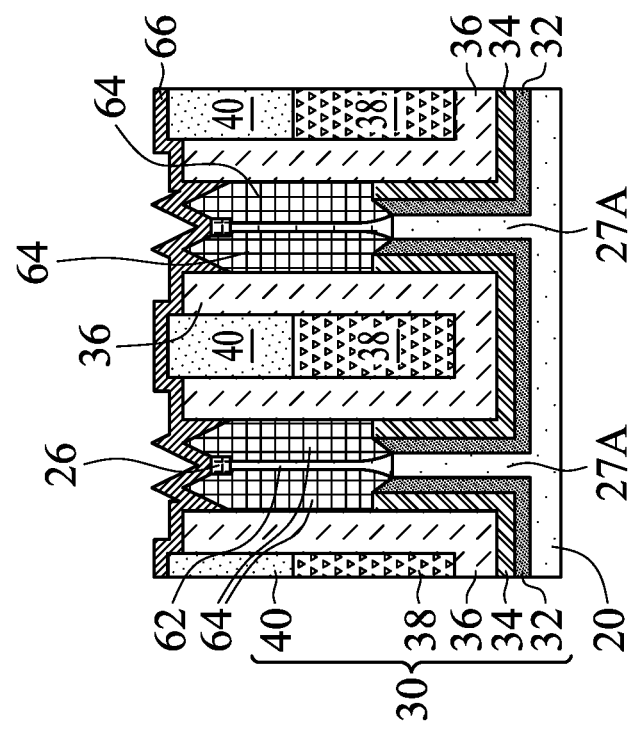
Figure 11C:
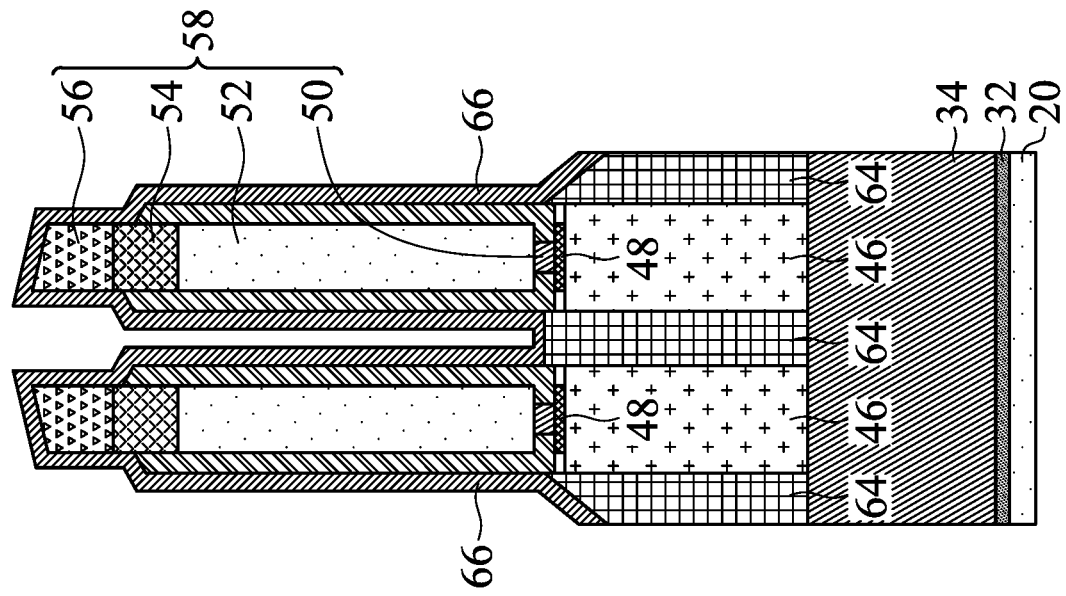
Figure 11D:
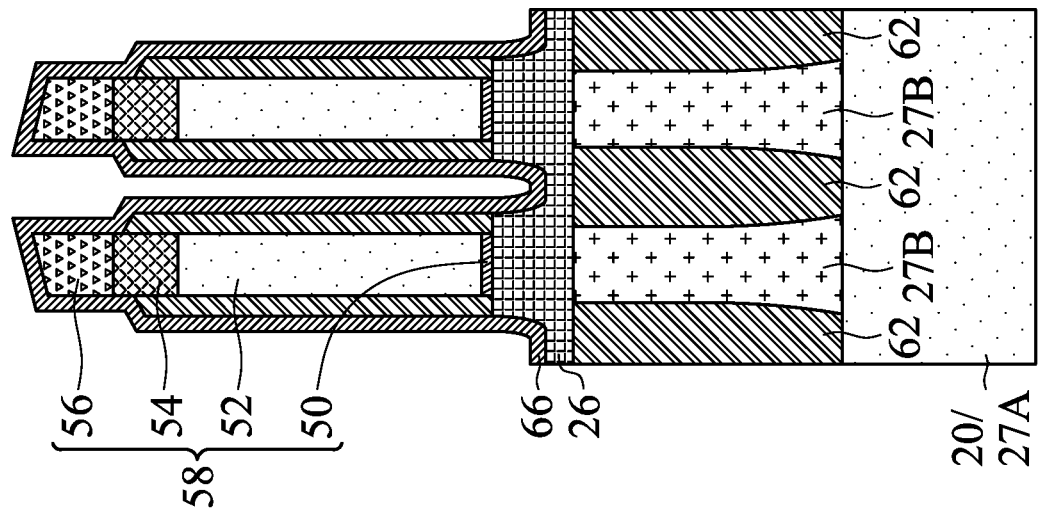

FIGS. 10A, 10B, 10C, and 10D illustrate the formation of dummy epitaxy regions 64, which may be formed through epitaxial growth. The respective process is illustrated as process 222 in the process flow 200 shown in FIG. 24. It is appreciated that the epitaxial growth of dummy epitaxy regions 64 is started from semiconductor fins 46, as shown in FIG. 10D. Accordingly, although dummy epitaxy regions 64 are shown as contacting dielectric regions (as shown in FIG. 10A), epitaxial growth is still achieved. The material of dummy epitaxy regions 64 is different from the material of semiconductor fins 46 (FIGS. 10B and 10D). In accordance with some embodiments, dummy epitaxy regions 64 are formed of silicon germanium, with the germanium percentage in dummy epitaxy regions 64 being higher than the germanium atomic percentage in semiconductor fins 46, for example, by a difference of about 20 percent or greater. For example, the germanium percentage in dummy epitaxy regions 64 may be in the range between about 20 percent and about 50 percent. It is appreciated that the germanium percentage in dummy epitaxy regions 64 cannot be too high or too low. If it is too low, there isn't enough etching selectivity between dummy epitaxy regions 64 and silicon fins 46. If the germanium percent is too high, there will be process issues in the epitaxy due to the too large difference between dummy epitaxy regions 64 and semiconductor fins

46. The thickness T4 of dummy epitaxy regions 64 may be in the range between about 10 nm and about 20 nm.

In subsequent processes, the dummy epitaxy regions 64 are replaced with replacement source and drain regions. In accordance with some embodiments of the present disclosure, the replacement source/drain regions on the opposite sides of the same dummy dielectric fin 62 are of opposite conductivity types. The replacement source/drain regions on the opposite sides of the same dummy dielectric fin 62 may be the source/drain regions of a p-type FinFET and an n-type FinFET, respectively.

The formation of p-type replacement source and drain regions are illustrated in FIGS. 11A, 11B, 11C, 11D, 12A, 12B, 12C, 12D, 12E, 13A, 13B, 13C, 13D, 14A, 14B, 14C, and 14D. FIGS. 11A, 11B, 11C, and 11D illustrate the formation of a first patterning mask 66. In accordance with some embodiments, the first patterning mask 66 is formed of silicon nitride, silicon oxy-carbo-nitride, or the like. The deposition process is a conformal deposition process such as ALD, CVD, or the like. The thickness of the first patterning mask 66 may be in the range between about 2 nm and about 4 nm.

Figure 12A:
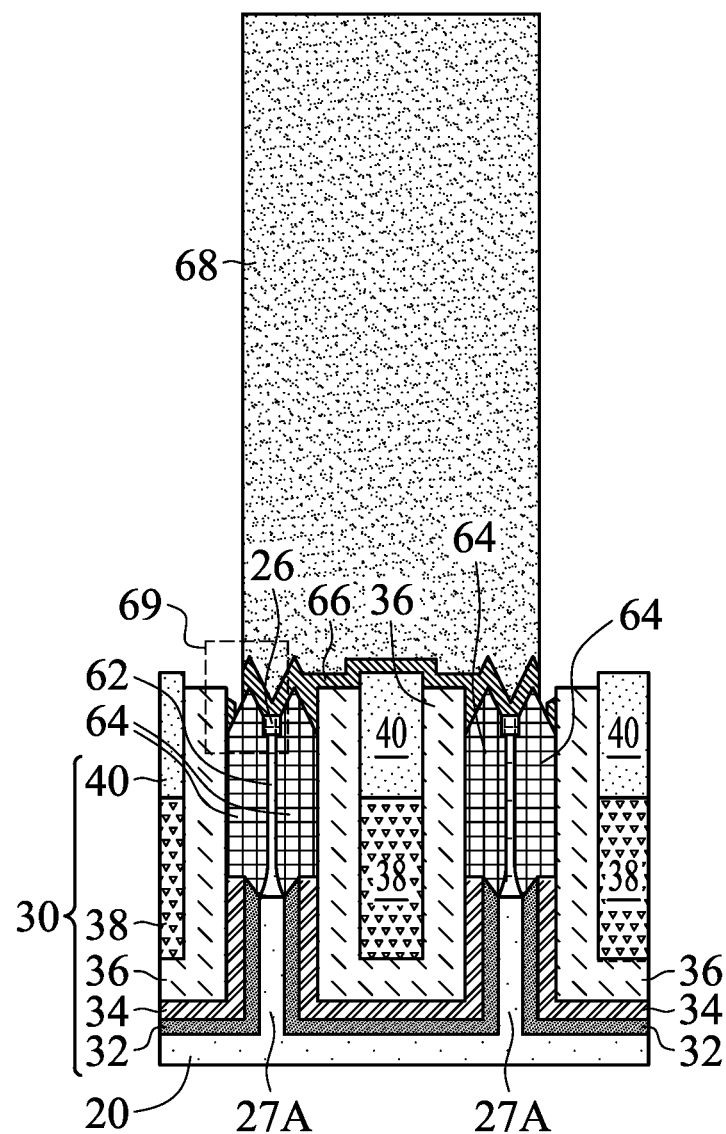
Figure 12B:
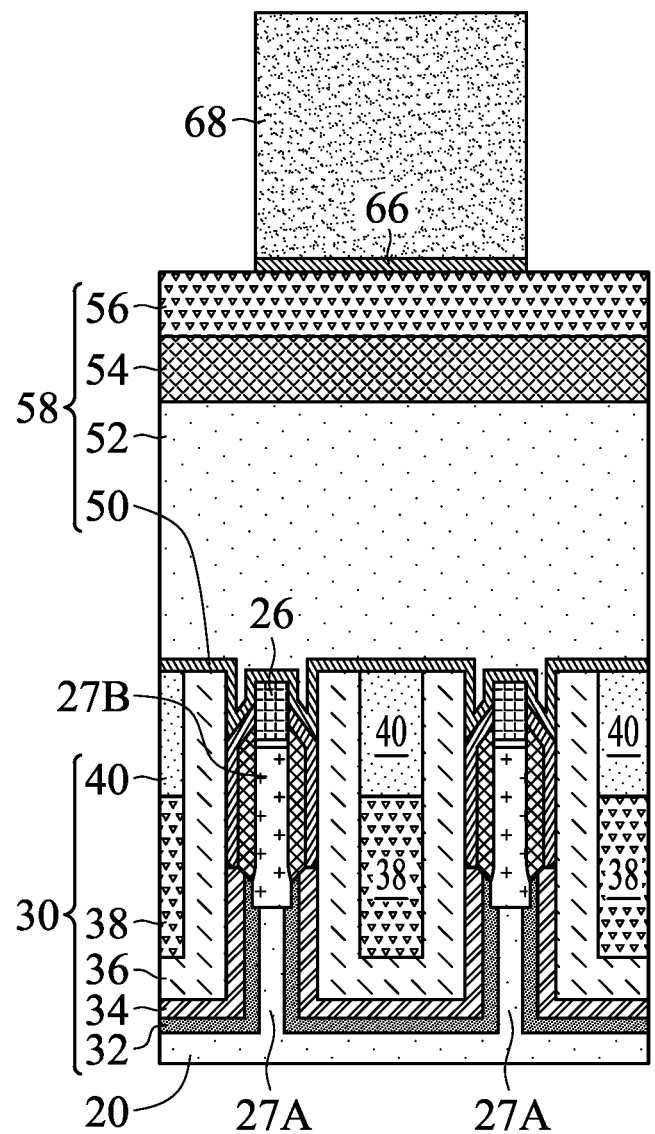
Figure 12C:
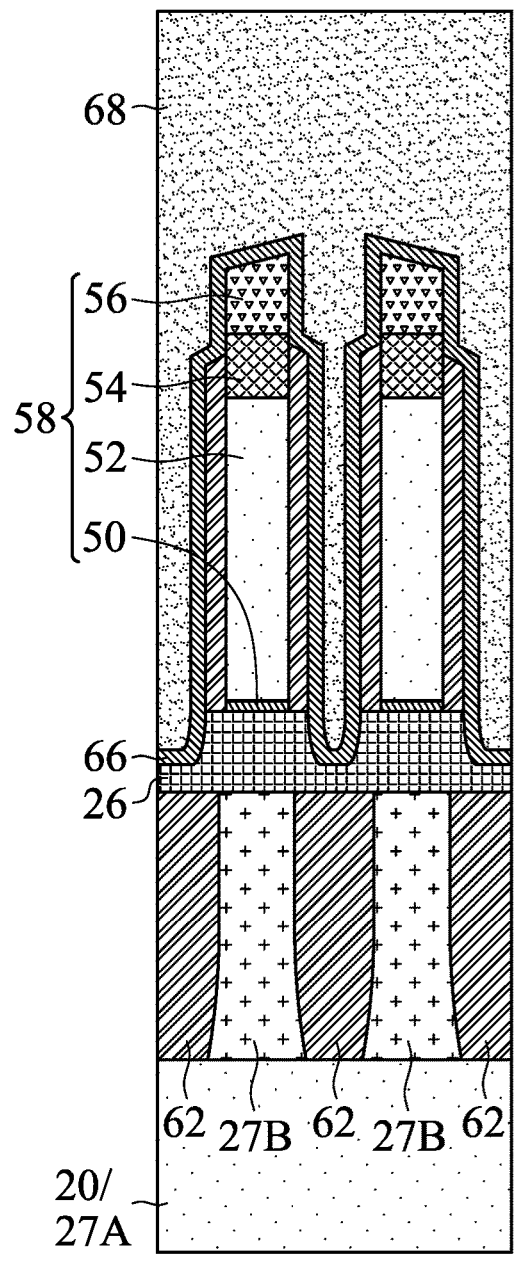
Figure 12D:
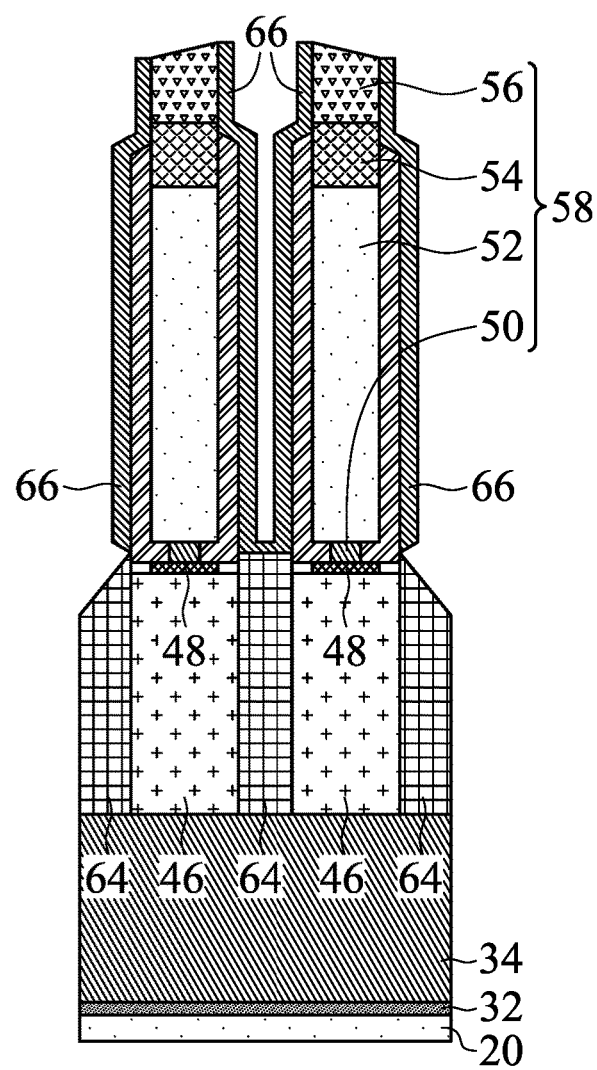

Referring to FIGS. 12A, 12B, 12C, and 12D, photo resist 68 is applied and patterned. As shown in FIGS. 12A and 12D, some portions of the first patterning mask 66 on one side (left side or right side) of the respective dielectric fins 62 are exposed. The entireties of the first patterning mask 66 on the other side (the corresponding right side or left side) of the respective dielectric fins 62 are covered by photo resist 68, as shown in FIGS. 12A and 12C. The dummy gate stacks 58 are partially covered (FIG. 12B) since photo resist 68 has strip shapes. It is appreciated that when the overlay variation in the formation of photo resist is carefully controlled, for example, to be smaller than about 15 nm, the portions of first patterning mask 66 overlapping the intended dummy epitaxy regions 64 may be removed without removing un-intended dummy epitaxy regions 64 in subsequent processes.

Figure 12E:
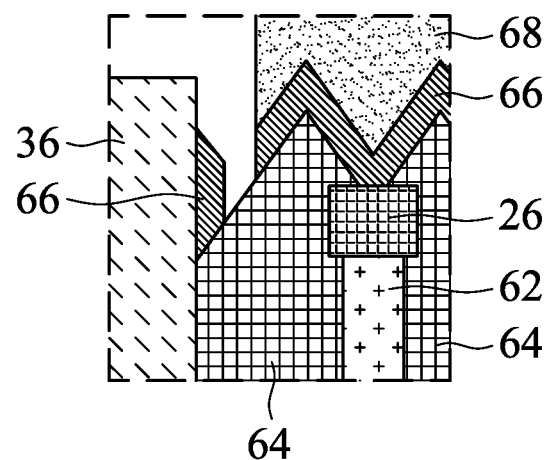
Figure 13B:
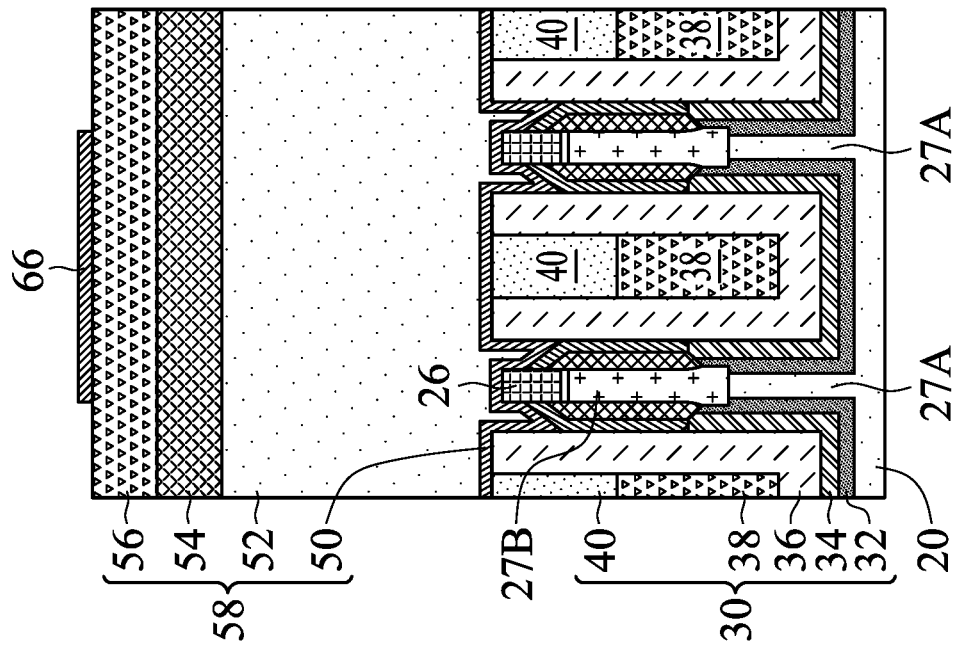
Figure 13A:
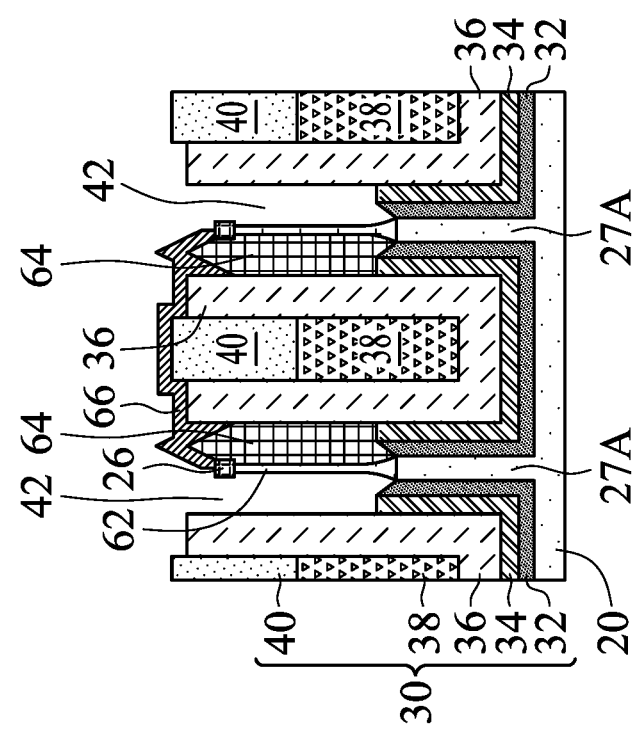
Figures 13C, 13D:
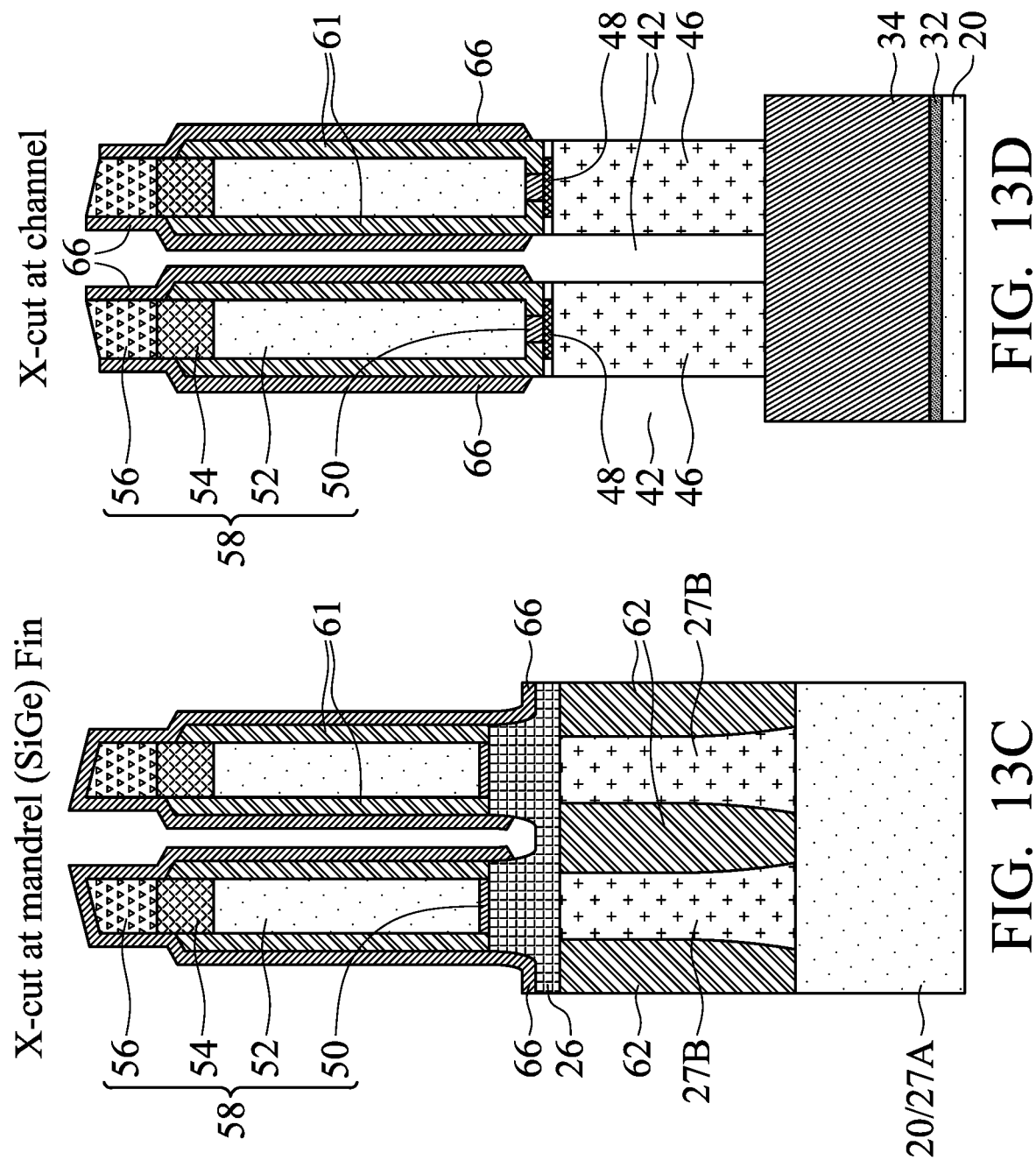

FIG. 12E illustrates an amplified view of region 69 in FIG. 12A. As shown in FIG. 12E, the horizontal portions of the first patterning mask 66 exposed through photo resist 68 are removed, exposing the underlying dummy epitaxy region 64, allowing dummy epitaxy region 64 to be removed in subsequent processes. There may be, or may not be, some vertical portions of first patterning mask 66 left. The remaining vertical portions of first patterning mask 66 may be, or may not be, consumed in the subsequent etching of dummy epitaxy region 64.

The exposed dummy epitaxy regions 64 are then removed in an etching process, with dielectric fins 62 un-etched in the etching process. Accordingly, the dummy epitaxy regions 64 on one side (either left side or right side) of the respective dielectric fins 62 are removed, so that trenches 42 are re-developed. The respective process is illustrated as process 224 in the process flow 200 shown in FIG. 24. The resulting structure is shown in FIGS. 13A, 13B, 13C, and 13D. The etching process of dummy epitaxy regions 64 may be either a dry etching process or a wet etching process. When the dummy epitaxy regions 64 are formed of silicon germanium, and when wet etching process is used, dummy epitaxy regions 64 may be etched using ozone ($O_3$), ammonia ($NH_3$), a first chemical solution, or a second chemical solution. The first chemical solution (sometimes referred to as Standard Clean 1 (SC1) solution) may comprise $NH_4OH$, $H_2O_2$, and $H_2O$. The second chemical solution (sometimes referred to as Standard Clean 2 (SC2) solution) may comprise HCl, $H_2O_2$, and $H_2O$, or the like. When the dummy epitaxy regions 64 are formed of silicon germanium, and when dry etching process is used, dummy epitaxy regions 64 may be etched using HF, $F_2$, or the like. After the etching process, the top edges of dielectric layers 34 and dielectric liners 32 are exposed to the resulting trenches 42. The sidewalls of dielectric layers 36 and dielectric fins 62 are also exposed to the trenches 42.

Figure 14B:
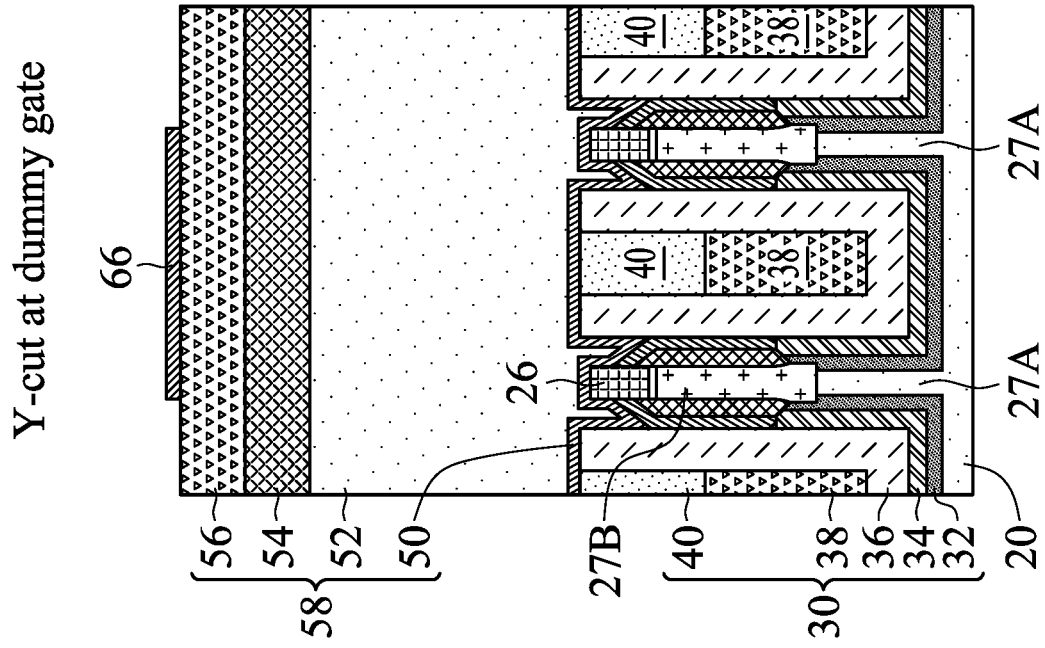
Figure 14A:
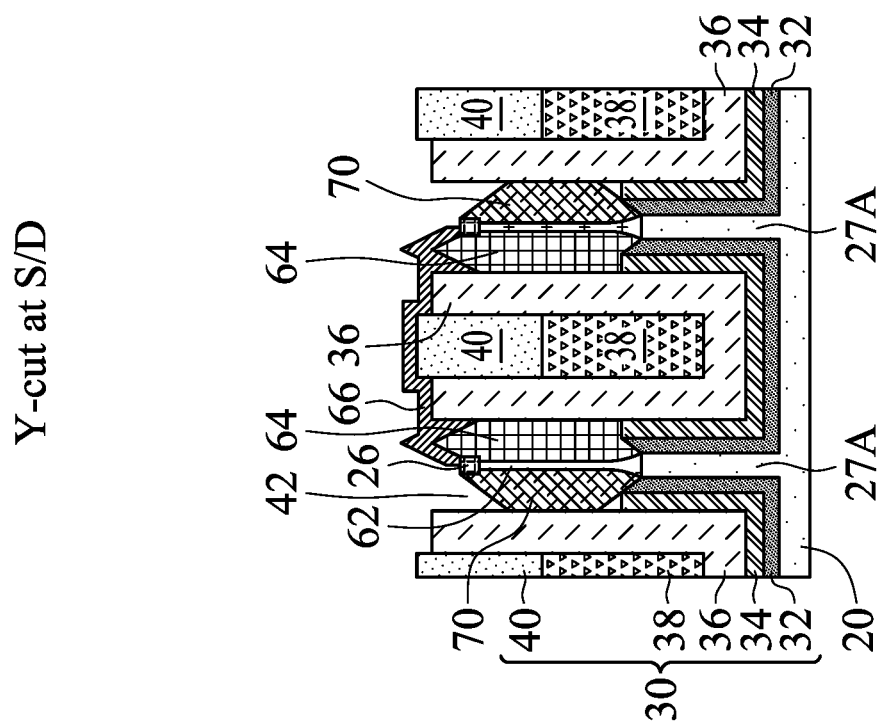
Figures 14C, 14D:
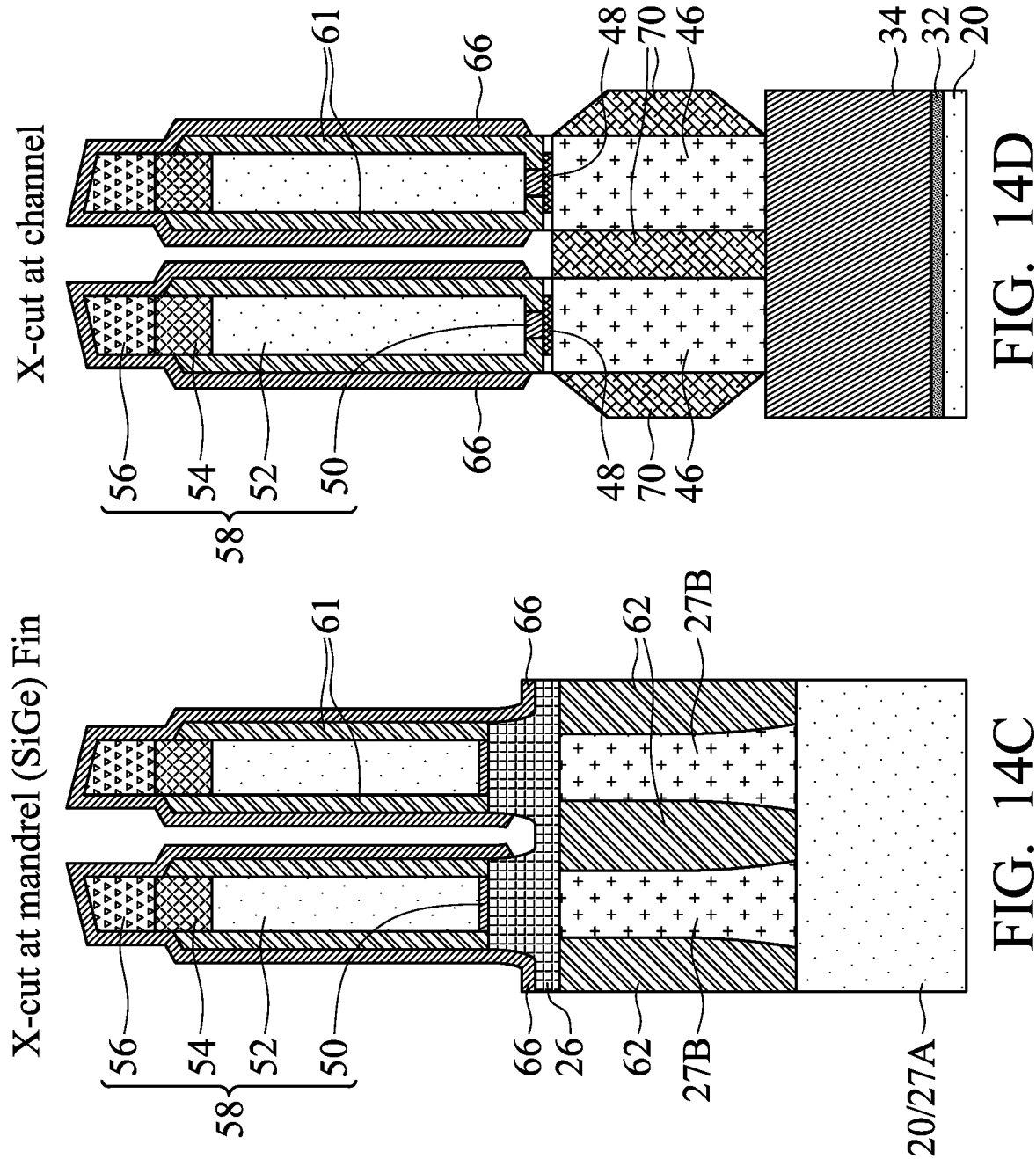
Figure 15B:
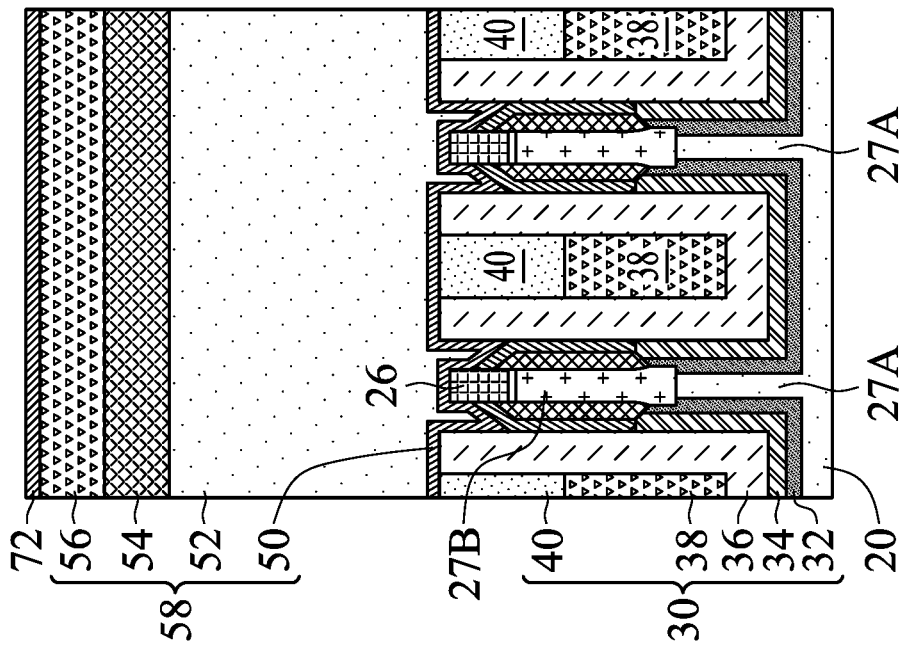
Figure 15A:
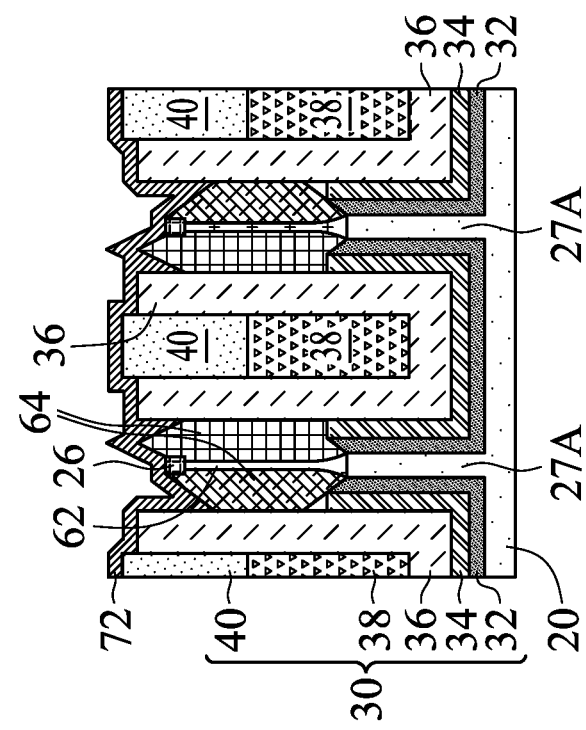
Figures 15C, 15D:
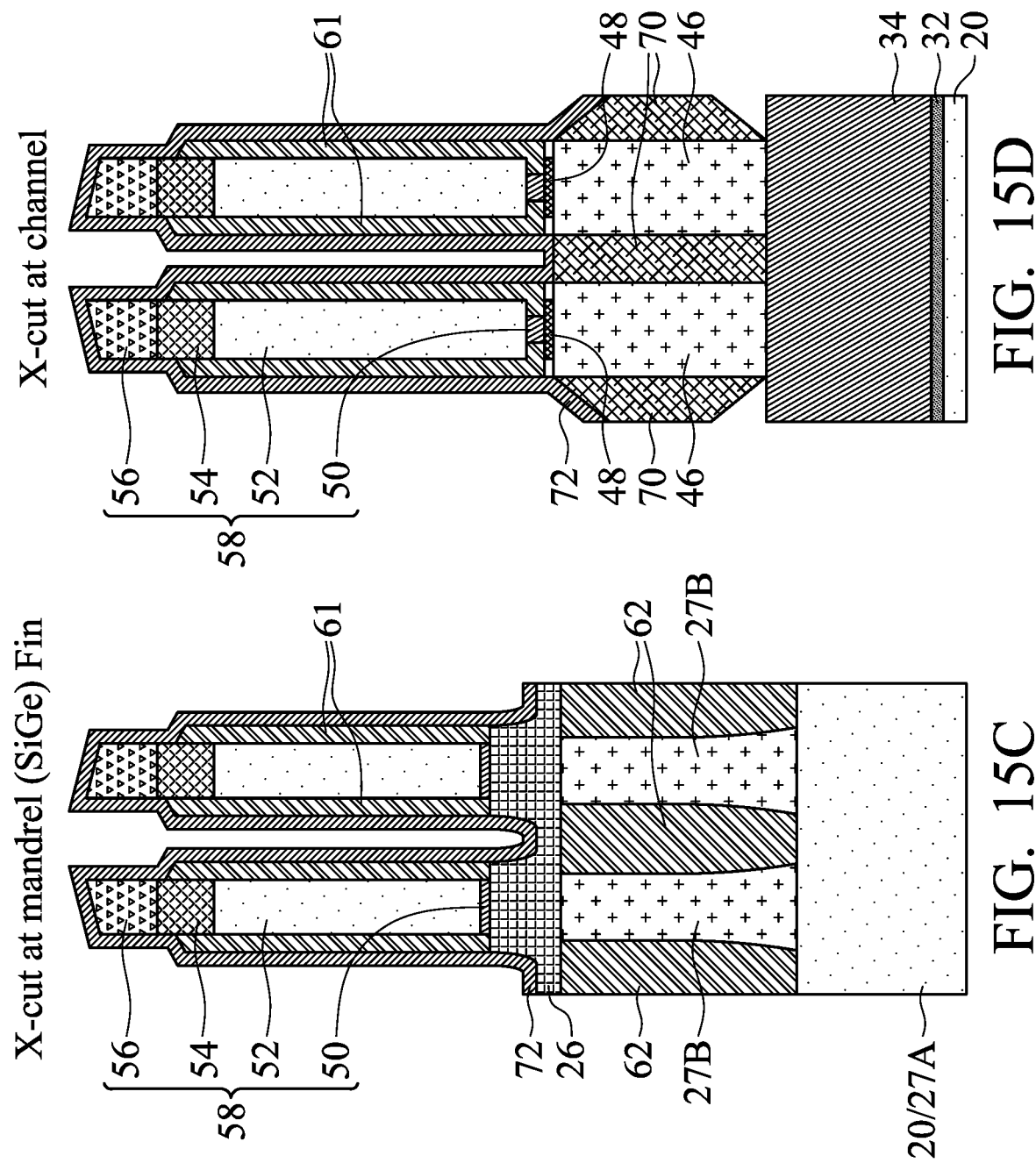

FIGS. 14A, 14B, 14C, and 14D illustrate the formation of p-type source/drain regions 70. The respective process is illustrated as process 226 in the process flow 200 shown in FIG. 24. The growth is selective, so that source/drain regions 70 are grown starting from the sidewalls of the portions of semiconductor fins 46, which portions of semiconductor fins 46 are directly under dummy gate stacks 58 and gate spacers 61 (FIG. 14D). The growth does not start from dielectric materials such as dielectric layers 32, 34, 36, dielectric fins 62, gate spacers 61, first patterning mask 66, etc., as shown in FIGS. 14B and 14C. The grown p-type source/drain regions 70 fill trenches 42, as shown in FIG. 14A. In the growth of p-type source/drain regions 70, a p-type impurity such as boron, indium, or the like may be in-situ doped. For example, the p-type source/drain regions 70 may be formed of silicon boron (SiB), silicon germanium boron (SiGeB), or the like. After the formation of p-type source/drain regions 70, photo resist 68 (FIGS. 12A, 12B, and 12C) is removed. The remaining portions of the first patterning mask 66 are then removed.

FIGS. 15A, 15B, 15C, 15D, 16A, 16B, 16C, 16D, 16E, 17A, 17B, 17C, 17D, 18A, 18B, 18C, and 18D illustrate the processes of forming n-type replacement source/drain regions. FIGS. 15A, 15B, 15C, and 15D illustrate the formation of a second patterning mask 72. In accordance with some embodiments, the second patterning mask 72 is formed of silicon nitride, silicon oxy-carbo-nitride, or the like. The deposition process includes a conformal deposition process such as ALD, CVD, or the like. The thickness of the second patterning mask 72 may be in the range between about 2 nm and about 4 nm.

Figure 16A:
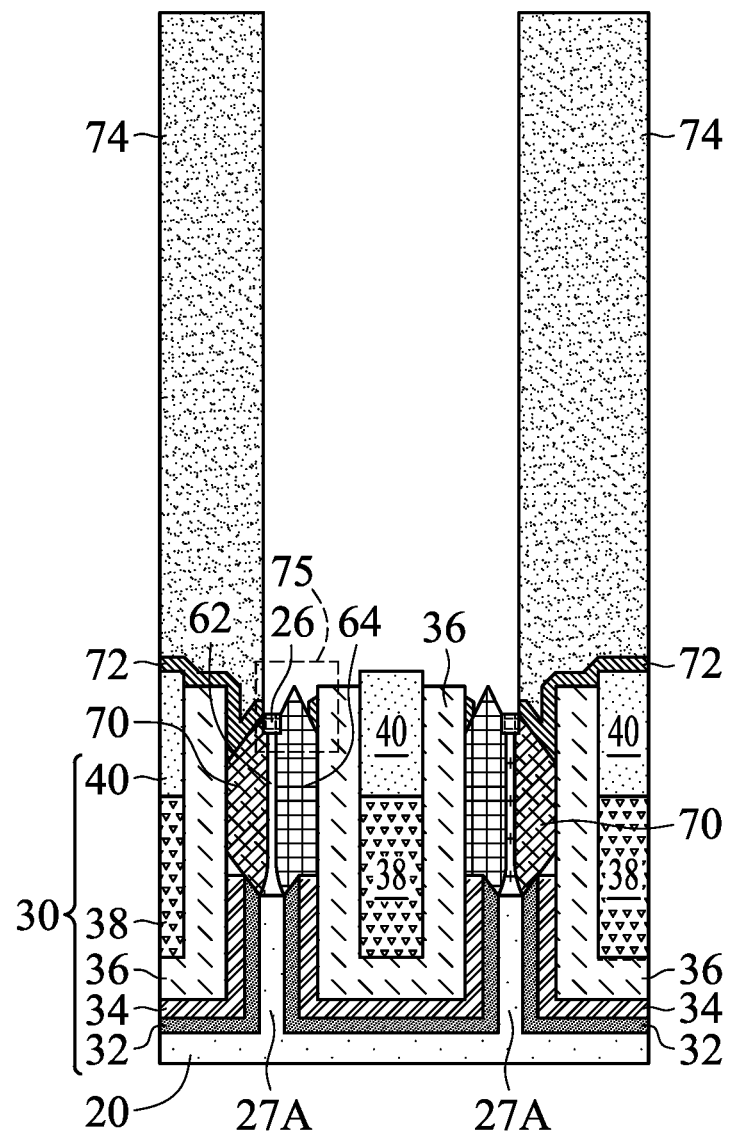
Figure 16B:
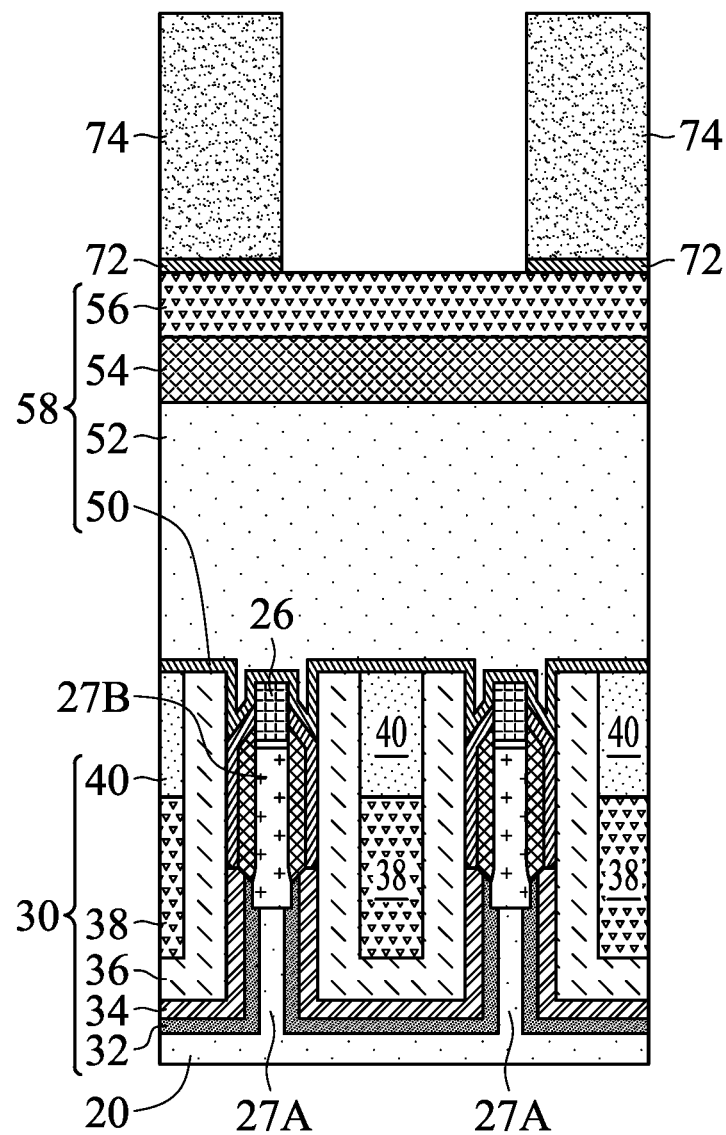
Figure 16C:
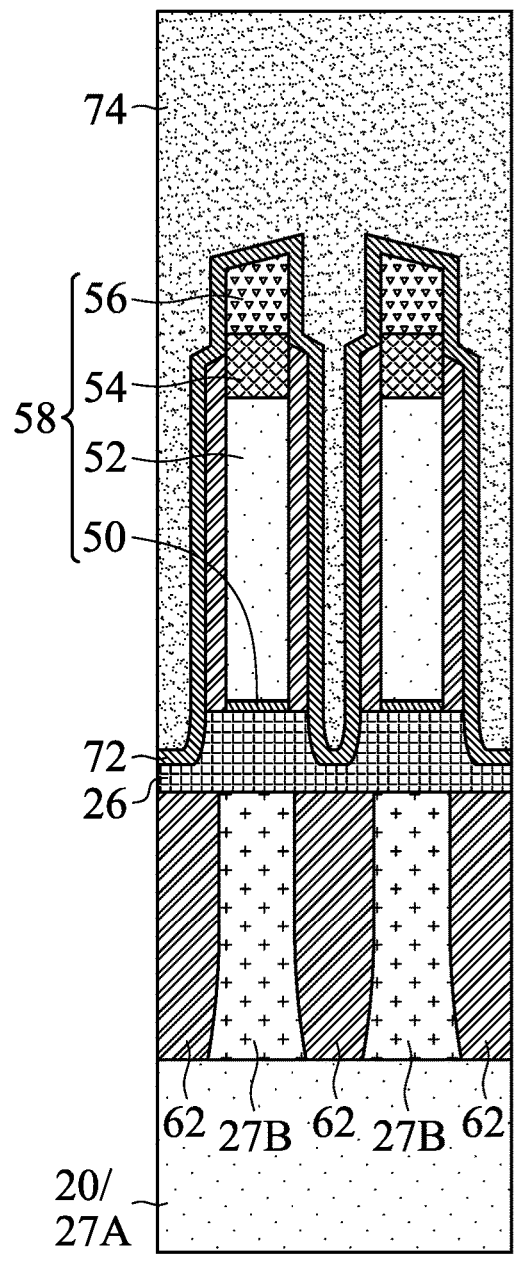
Figure 16D:
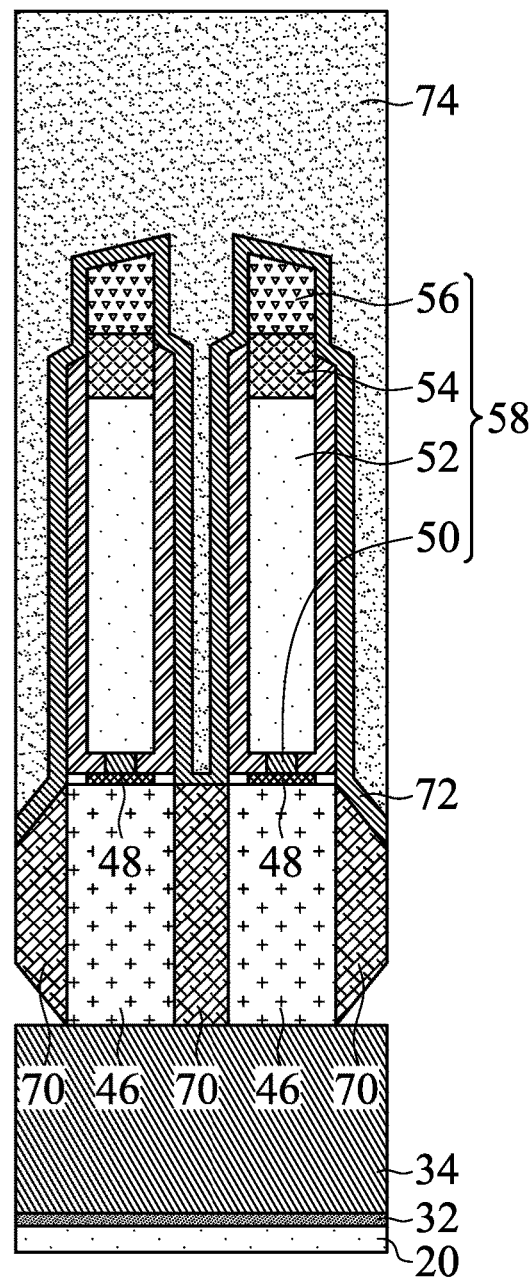

Referring to FIGS. 16A, 16B, 16C, and 16D, photo resist 74 is applied and patterned. As shown in FIG. 16A, some portions of the second patterning mask 72 on one side (left side or right side) of the respective dielectric fins 62 are exposed, and the entireties of the second patterning mask 72 on the other side (right side or left side) of the respective dielectric fins 62 are covered by photo resist 74, as shown in FIGS. 16A, 16C and 16D. The dummy gate stacks 58 (FIG. 16B) are partially covered since photo resist 74 has strip shapes.

Figure 16E:
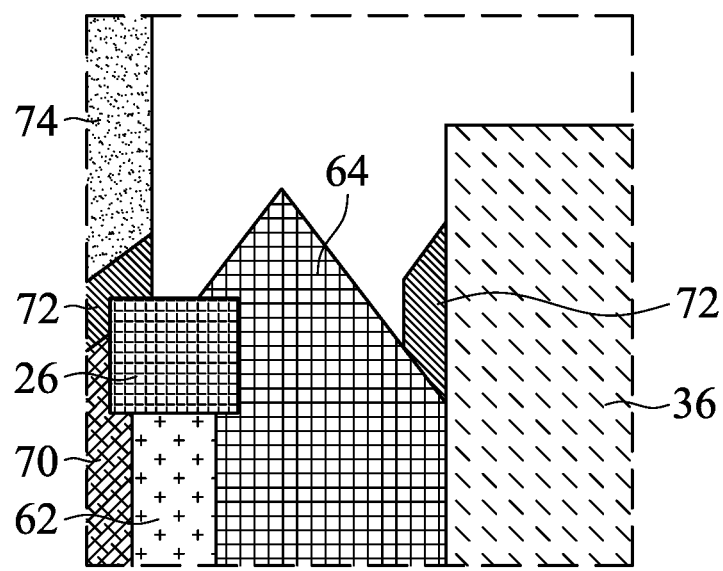
Figure 17B:
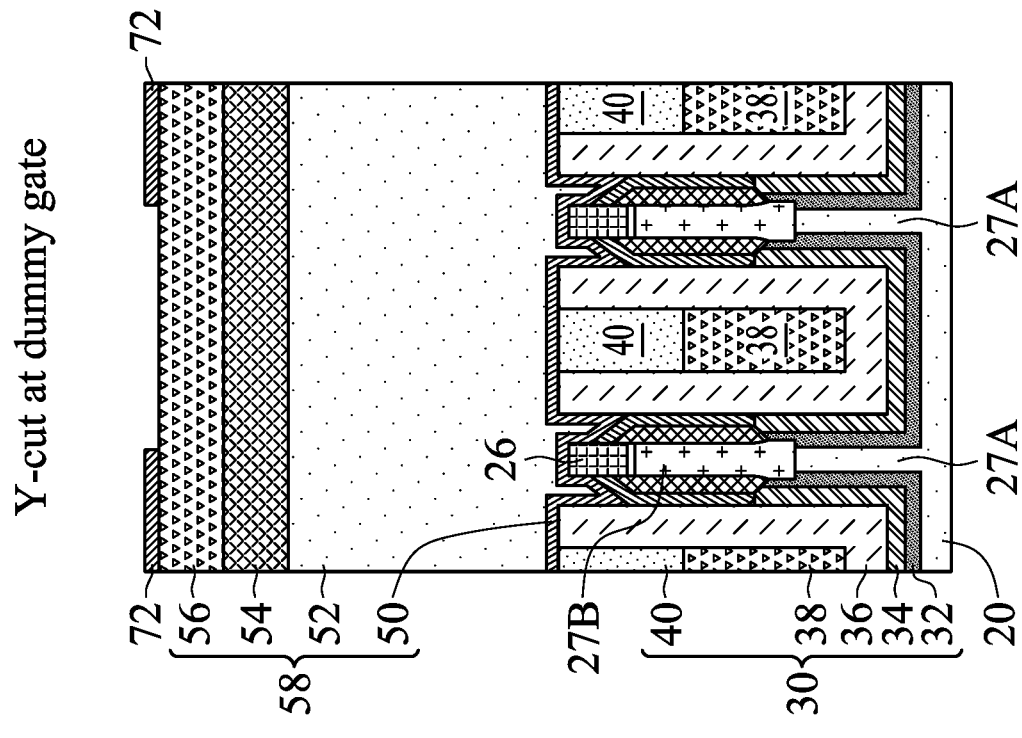
Figure 17A:
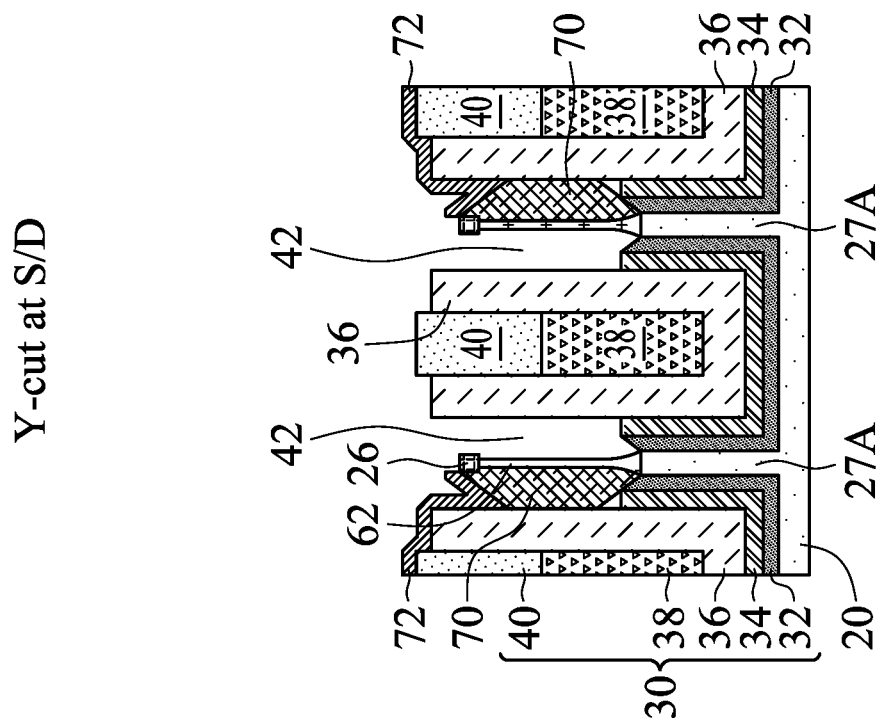
Figures 17C, 17D:
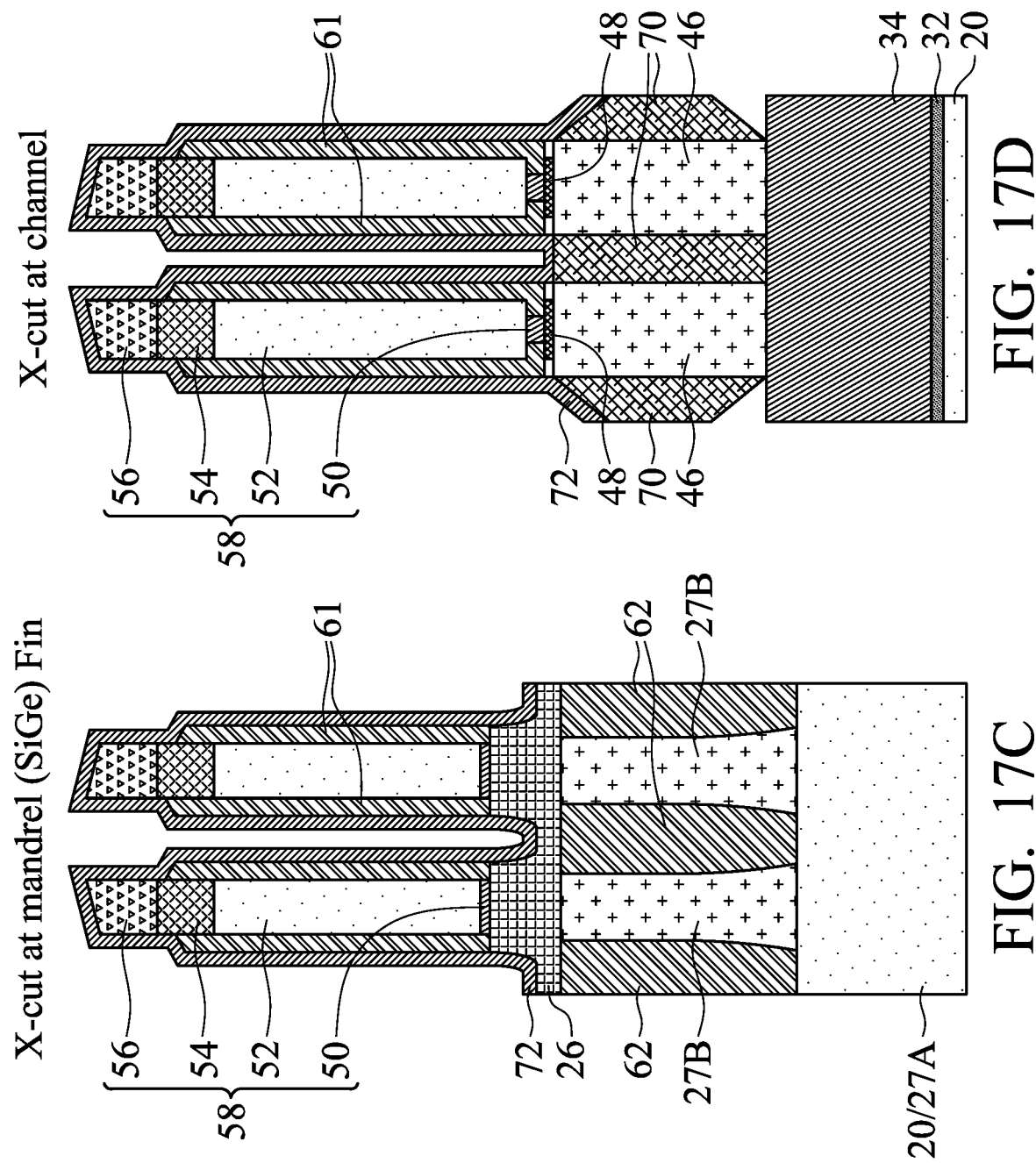

FIG. 16E illustrates an amplified view of region 75 in FIG. 16A. As shown in FIG. 16E, the horizontal portions of the second patterning mask 72, which horizontal portions are exposed through photo resist 74, are removed, exposing the underlying dummy epitaxy region 64, allowing dummy epitaxy region 64 to be removed. There may be, or may not be, some vertical portions of second patterning mask 72 left. The remaining vertical portions of the second patterning mask 72 may be, or may not be consumed in the subsequent etching of dummy epitaxy region 64.

The exposed dummy epitaxy regions 64 are then removed in an etching process, with dielectric fins 62 un-etched in the etching process. Accordingly, the dummy epitaxy regions 64 on one side (either left side or right side) of the respective dielectric fins 62 are removed, so that trenches 42 are re-developed. The respective process is illustrated as process 228 in the process flow 200 shown in FIG. 24. The resulting structure is shown in FIGS. 17A, 17B, 17C, and 17D. The etching process of dummy epitaxy regions 64 may include either a dry etching process or a wet etching process. The etchant may be selected from the same candidate groups of etchants as in the etching process shown in FIG. 13A. After the etching process, the top edges of dielectric layer 34 and dielectric liner 32 are exposed to the resulting trenches 42. The sidewalls of dielectric layers 36 and dielectric fins 62 are also exposed to the trenches 42. Photo resist 74 is then removed.

FIGS. 18A, 18B, 18C, and 18D illustrate the formation of n-type source/drain regions 76. The respective process is illustrated as process 230 in the process flow 200 shown in FIG. 24. The formation is selective, so that source/drain regions 76 are grown starting from the sidewalls of the portions of semiconductor fins 46, which portions of semiconductor fins 46 are directly under dummy gate stacks 58 and gate spacers 61. The selective growth does not start from dielectric materials such as patterning mask 72, dielectric layers 32, 34, 36, dielectric fins 62, gate spacers 61, etc., as shown in FIGS. 18B, 18C and 18D. The grown n-type source/drain regions 76 fill trenches 42, as shown in FIG. 18A. In the growth of n-type source/drain regions 76, an n-type impurity such as phosphorous, arsenic, antimony, or the like may be in-situ doped. For example, the n-type source/drain regions 76 may be formed of silicon phosphorous (SiP), silicon carbon phosphorous (SiCP), or the like. In accordance with some embodiments, p-type source/drain regions 70 may be formed either before or after the formation of n-type source/drain regions 76.

In subsequent processes, the remaining portions of patterning mask 72 are removed. Contact Etch Stop Layer (CESL) 77 and Inter-Layer Dielectric (ILD) 78 are then formed, as shown in FIGS. 19A, 19C, and 19D. The respective process is illustrated as process 232 in the process flow 200 shown in FIG. 24. CESL 77 may be formed using a conformal deposition method such as ALD or CVD, for example. ILD 78 may include a dielectric material formed using, for example, FCVD, spin-on coating, CVD, PECVD, or other deposition methods. ILD 78 may also be formed of silicon oxide, Phospho-Silicate Glass (PSG), Boro-Silicate Glass (BSG), Boron-Doped Phospho-Silicate Glass (BPSG), or the like. A planarization step such as a CMP process or a mechanical grinding process may be performed to level the top surfaces of ILD 78, dummy gate stack 58 (FIGS. 18B, 18C, and 18D), and gate spacers 61 with each other.

Figure 19B:
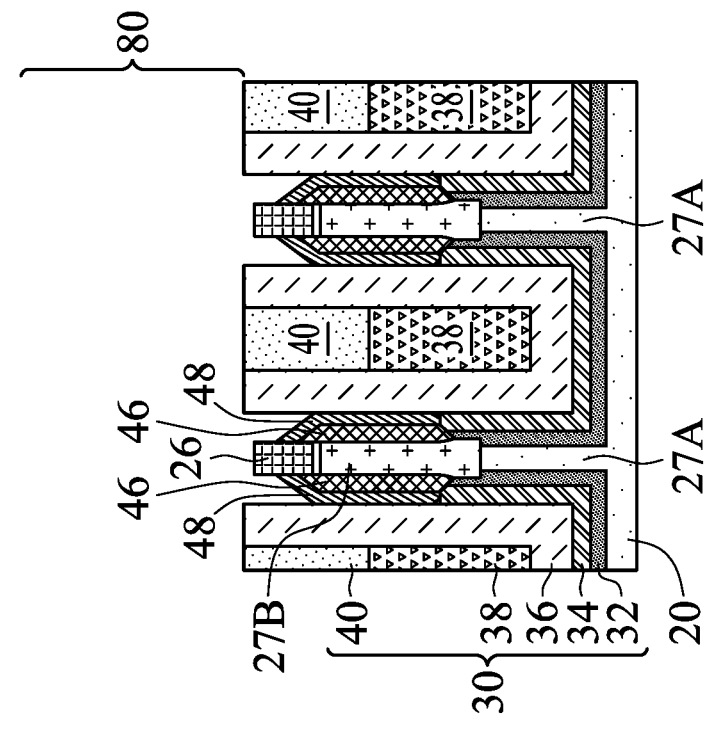
Figure 19A:
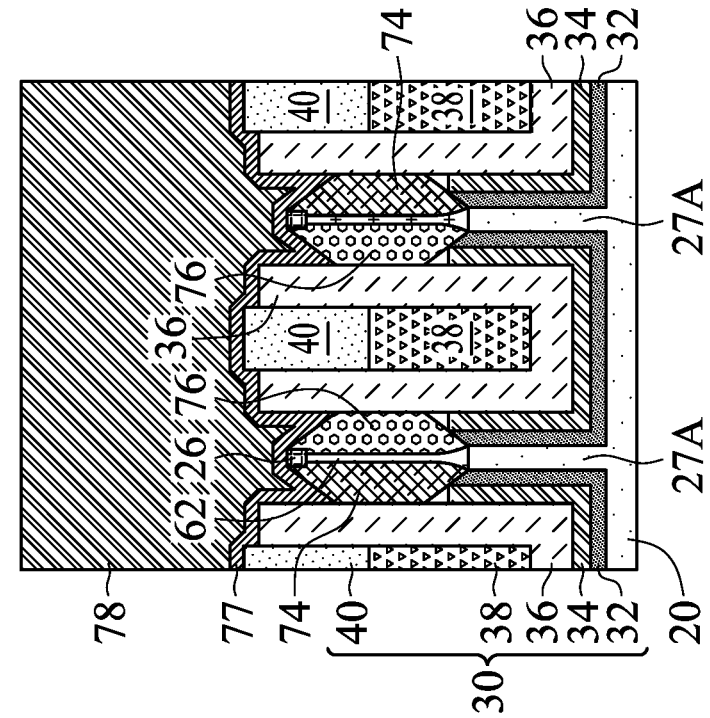

In a subsequent process, the dummy gate stack 58 (FIGS. 18B, 18C, and 18D) are removed, forming trenches 80 as shown in FIGS. 19B, 19C, and 19D. The respective process is illustrated as process 234 in the process flow 200 shown in FIG. 24. Trenches 80 are between, and are exposed to, gate spacers 61, and the underlying dummy semiconductor layers 48 are exposed to trenches 80. As shown in FIG. 19B, since the (polysilicon) dummy gate electrode 52 do not extend into high-aspect-ratio spaces between high semiconductor fins as in conventional process, the removal of the dummy gate electrode 52 does not involve high-aspect-ratio etching process. The removal of dummy gate electrode 52 is thus less prone to process errors.

Next, dummy semiconductor layers 48 are removed using an etchant that etches dummy semiconductor layers 48, but does not etch semiconductor fins 46. Mask layer 26 and mandrels 27B (FIG. 19B) are also etched. Trenches 80 thus extend downwardly to the same level as semiconductor fins 46. The resulting structure is shown in FIGS. 20A, 20B, 20C, and 20D.

Referring to FIG. 20B, each of semiconductor fins 46 has at least three sides, which include top side, left side, and right side being exposed to the corresponding trenches 80. In accordance with some embodiments, the bottom sides of semiconductor fins 46 are joined to the top edges of dielectric layer 34 and dielectric liner 32. In accordance with alternative embodiments, the bottom sides of semiconductor fins 46 are spaced apart from the top edges of dielectric layers 34 and dielectric liners 32 by gaps. Alternatively stated, in the cross-sectional view as shown in FIG. 20B, semiconductor fins 46 may be suspended. This occurs when the top portions of dielectric layer 34 and dielectric liner 32 are recessed in the preceding etching processes and the corresponding cleaning processes. The regions 81 illustrate where gaps 82 (FIG. 20D) may be formed to separate semiconductor fins 46 from the corresponding underlying dielectric layers 34 and dielectric liners 32. FIG. 20D illustrates the gaps 82. The source/drain regions 70 and 76 underlying CESL 77 and ILD 78 remain intact, as shown in FIG. 20A.

Referring back to FIG. 19C, under trenches 80, there are mask layer 26 and mandrels 27B. The etching of these portions results in the trenches 80 to extend down to semiconductor strip portions 27A, as shown in both of FIGS. 20B and 20C.

Figure 21B:
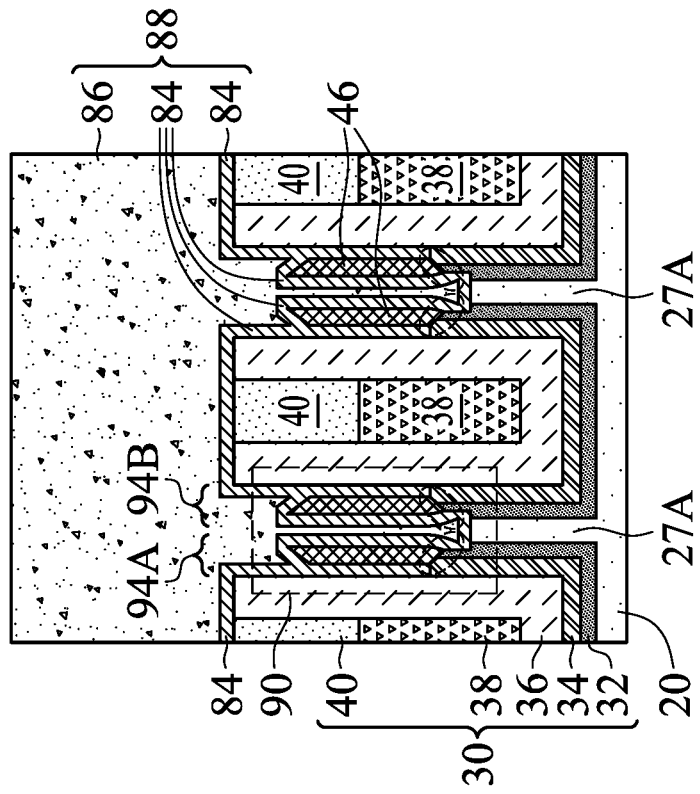
Figure 21A:
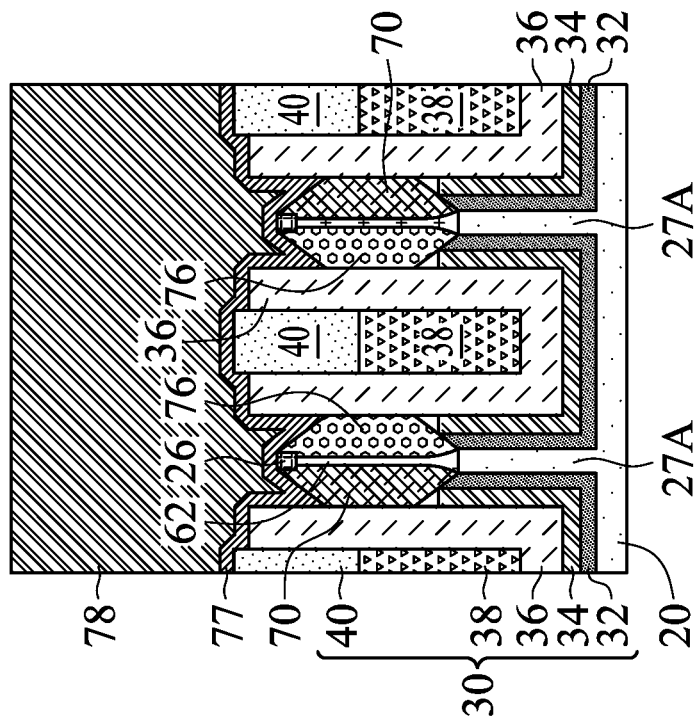
Figure 22:
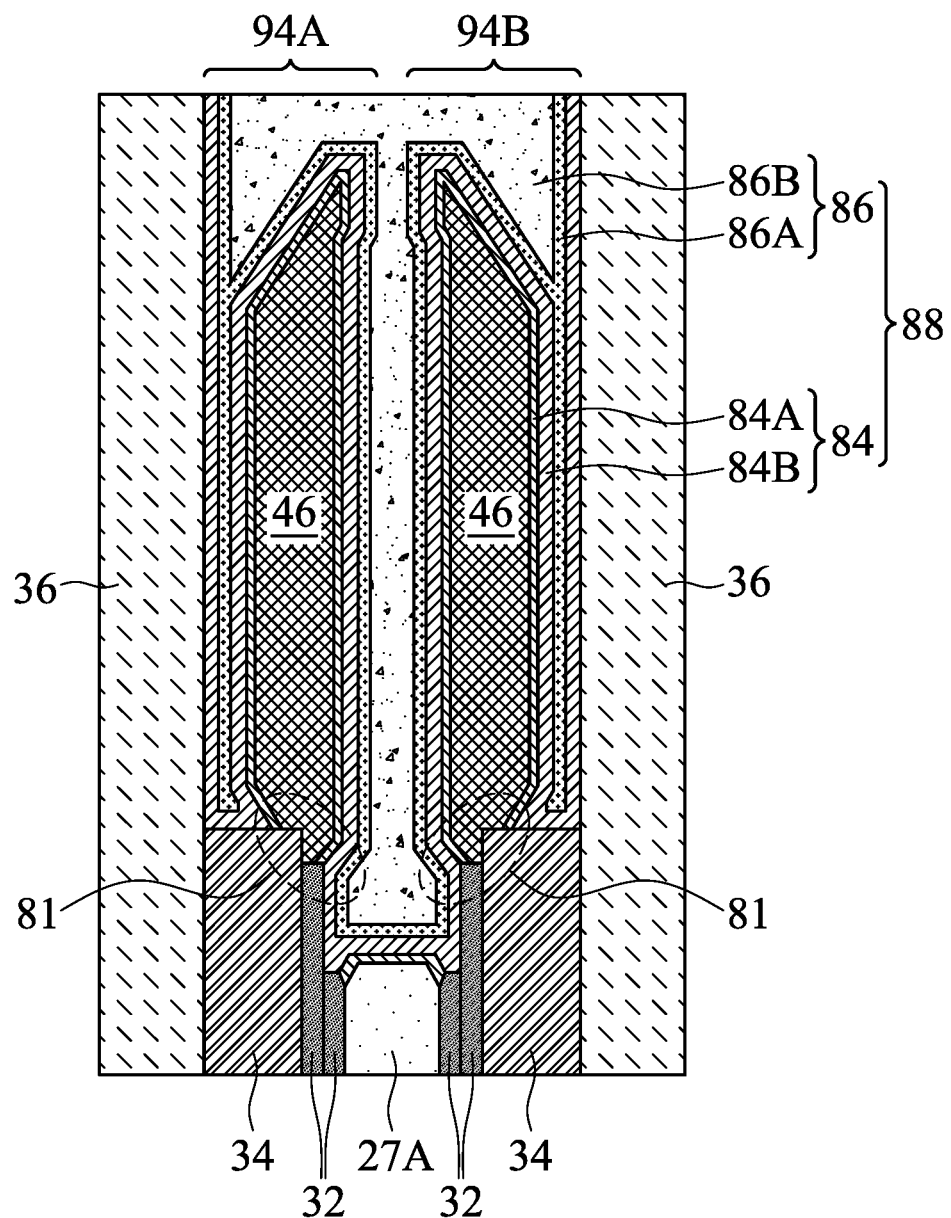
Figure 23:
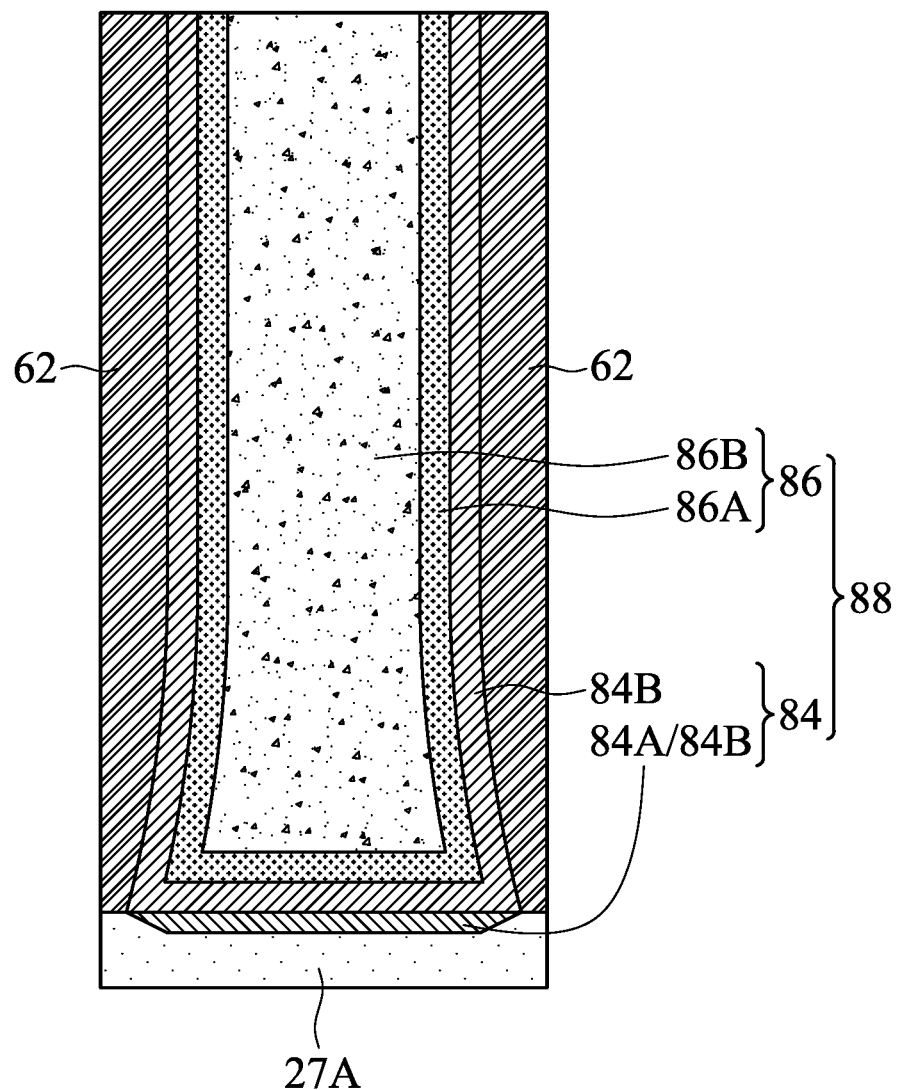

FIGS. 21A, 21B, 21C, and 21D illustrate the formation of replacement gate stacks 88, which include gate dielectric 84 and gate electrode 86 over the corresponding gate dielectric 84. The respective process is illustrated as process 236 in the process flow 200 shown in FIG. 24. FIG. 22 illustrates an amplified view of region 90 in FIG. 21B, and FIG. 23 illustrates an amplified view of region 92 in FIG. 21C. In the formation of replacement gate 88, gate dielectric 84 (FIG. 21B) is first formed, which extends into trenches 80 (and possibly gaps 82 (FIG. 20D)) if they are formed) and may have a portion extending over ILD 78. In accordance with some embodiments of the present disclosure, gate dielectric 84 includes an Interfacial Layer 84A (IL, FIG. 22) as its lower part. The IL 84A may include an oxide layer such as a silicon oxide layer, which is formed through a chemical oxidation process or a deposition process. Gate dielectric 84 may also include a high-k dielectric layer 84B (FIG. 22) formed over the IL 84A. The high-k dielectric layer 84B is formed as a conformal layer, and includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. In accordance with some embodiments of the present disclosure, the high-k dielectric layer 84B in gate dielectric 84 is formed using ALD or CVD.

Gate electrode 86 is formed over gate dielectric 84 and filling the remaining portion of the trench 80. The formation of gate electrode 86 may include a plurality of deposition processes to deposit a plurality of conductive layers, and performing a planarization step to remove the excess portions of the conductive layers over ILD 78. The deposition of the conductive layers may be performed using conformal deposition methods such as ALD or CVD.

Gate electrode 86 may include a diffusion barrier layer (not shown) and one (or more) work-function layer 86A (FIGS. 22 and 23) over the diffusion barrier layer. The diffusion barrier layer may be formed of titanium nitride (TiN), which may (or may not) be doped with silicon to form TiSiN. The work-function layer 86A may be a mid-gap work function layer, or may be a p-type work function layer or an n-type work function layer. After the deposition of the work-function layer(s), another barrier layer (not shown), which may be another TiN layer, is formed. Gate electrodes 86 may also include a filling metal 86B, which may be formed of tungsten or cobalt, for example.

As shown in FIG. 22, which shows an amplified view of the portions of the gates and channel regions of p-type FinFET 94A and n-type FinFET 94B, p-type FinFET 94A and n-type FinFETs 94B share a common gate stack 88. The source/drain regions 70 (FIG. 21A) form the source/drain regions of the p-type FinFET 94A. The source/drain regions 76 (FIG. 21A) form the source/drain regions of the n-type FinFET 94B. Semiconductor fins 46 form the channel regions of p-type FinFET 94A and n-type FinFET 94B. In accordance with some embodiments, gate stacks 88 are on the three sides (top side, left side, and right side) of semiconductor fins 46, as shown in FIG. 22. The resulting transistors are FinFETs, and may have Ω-gates. In accordance with alternative embodiments in which gaps 82 (FIG. 20D) are formed, and gate dielectric 84 extends directly underlying semiconductor fins 46 to full encircle the respective semiconductor fins 46. Gate electrode 86 may (or may not) fully encircle the respective gate dielectrics 84 and semiconductor fins 46, so that the resulting transistors may be Gate-All-Around (GAA) Transistors.

The embodiments of the present disclosure have some advantageous features. By forming a mandrel, and then forming semiconductor fins on opposite sides of, and contacting, the mandrel, a p-type multi-gate transistor and an n-type multi-gate transistor may be formed based on a same semiconductor mandrel/strip. This significantly reduces the size of the transistors, for example, by about 20 percent to about 40 percent. GAA transistors or FinFETs (which may include Ω-gates) may be formed to improve the gate control. The process of the present disclosure is compatible with the existing FinFET formation process. Since the polysilicon dummy gates do not extend into the high-aspect-ratio spaces between high semiconductor fins as in conventional process, the removal of the polysilicon dummy gates does not involve high-aspect-ratio etching process, which is prone to process errors.

In accordance with some embodiments of the present disclosure, a method comprises forming an epitaxy semiconductor layer over a semiconductor substrate; etching the epitaxy semiconductor layer and the semiconductor substrate to form a semiconductor strip comprising an upper portion acting as a mandrel, wherein the upper portion is a remaining portion of the epitaxy semiconductor layer; and a lower portion under the mandrel, wherein the lower portion is a remaining portion of the semiconductor substrate; growing a first semiconductor fin starting from a first sidewall of the mandrel; growing a second semiconductor fin starting from a second sidewall of the mandrel, wherein the first sidewall and the second sidewall are opposite sidewalls of the mandrel; forming a first transistor based on the first semiconductor fin; and forming a second transistor based on the second semiconductor fin. In an embodiment, the forming the first transistor comprises forming a p-type transistor, and the forming the second transistor comprises forming an n-type transistor. In an embodiment, the forming the first transistor comprises: forming a dummy gate stack on a portion of the first semiconductor fin; removing the dummy gate stack to expose the portion of the first semiconductor fin; etching a dielectric region directly underlying the portion of the first semiconductor fin; and forming a replacement gate stack encircling the portion of the first semiconductor fin. In an embodiment, the method comprises growing a dummy semiconductor layer on the first semiconductor fin, wherein the dummy semiconductor layer and the first semiconductor fin are formed of different semiconductor materials. In an embodiment, the etching the epitaxy semiconductor layer and the semiconductor substrate further forms a first trench and a second trench on opposite sides of the semiconductor strip, and the method further comprises: forming a first isolation region and a second isolation region in the first trench and the second trench, respectively; and etching a first portion of the first isolation region and a second portion of the second isolation region to form recesses, wherein the first semiconductor fin and the second semiconductor fin are grown in the recesses. In an embodiment, the forming the first transistor and the forming the second transistor comprise forming a common gate stack shared by the first transistor and the second transistor. In an embodiment, the semiconductor substrate is a silicon substrate, and the forming the epitaxy semiconductor layer comprises epitaxially growing a silicon germanium layer.

In accordance with some embodiments of the present disclosure, a method comprises performing a first epitaxy to grow a first semiconductor fin and a second semiconductor fin from a first sidewall and a second sidewall of a semiconductor mandrel; forming a dummy gate stack on a first portion of each of the first semiconductor fin and the second semiconductor fin; removing a second portion of each of the first semiconductor fin and the second semiconductor fin; oxidizing the semiconductor mandrel to form a dielectric fin; growing a first dummy semiconductor region and a second dummy semiconductor region in spaces left by the removed second portions of the first semiconductor fin and the second semiconductor fin, respectively; replacing the first dummy semiconductor region and the second dummy semiconductor region with a first source/drain region and a second source/drain region, respectively; and replacing the dummy gate stack with a replacement gate stack. In an embodiment, the method comprises growing a first dummy semiconductor layer and a second dummy semiconductor layer on the first semiconductor fin and the second semiconductor fin, respectively, wherein the dummy gate stack is formed over the first dummy semiconductor layer and the second dummy semiconductor layer. In an embodiment, the method comprises, before the removing the second portion of each of the first semiconductor fin and the second semiconductor fin, performing an etching process to remove the first dummy semiconductor layer and the second dummy semiconductor layer. In an embodiment, the method comprises epitaxially growing an epitaxy layer on a semiconductor substrate; and etching the epitaxy layer on a semiconductor substrate to form a first trench and a second trench, wherein a portion of the epitaxy layer between the first trench and the second trench forms the semiconductor mandrel. In an embodiment, the method comprises forming a first isolation region and a second isolation region in the first trench and the second trench, respectively; and etching a portion of each of the first isolation region and the second isolation region to reveal the first sidewall and the second sidewall of the semiconductor mandrel. In an embodiment, the first source/drain region is of p-type, and the second source/drain region is of n-type. In an embodiment, the replacement gate stack fully encircles the first portion of the first semiconductor fin.

In accordance with some embodiments of the present disclosure, a device comprises a bulk semiconductor substrate; a semiconductor strip over and joined to the bulk semiconductor substrate; a gate stack comprising a first portion overlapping, and contacting, the semiconductor strip; a first semiconductor fin and a second semiconductor fin contacting opposite sidewalls of the first portion of the gate stack, wherein the gate stack further comprises a second portion on an opposite side of the first semiconductor fin than the first portion; a third portion on an opposite side of the second semiconductor fin than the first portion; a first source/drain region joining a sidewall of the first semiconductor fin; and a second source/drain region joining a sidewall of the second semiconductor fin. In an embodiment, the device comprises a first isolation region and a second isolation region, wherein lower portions of the first isolation region and the second isolation region are in contact with opposite sidewalls of the semiconductor strip. In an embodiment, the first source/drain region and the second source/drain region are of opposite conductivity types. In an embodiment, the device further comprises a dielectric fin, wherein the first source/drain region and the second source/drain region are in contact with opposite sidewalls of the dielectric fin. In an embodiment, the dielectric fin comprises silicon germanium oxide. In an embodiment, the dielectric fin overlaps and contacts the semiconductor strip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an epitaxy semiconductor layer over a semiconductor substrate;
   etching the epitaxy semiconductor layer and the semiconductor substrate to form a semiconductor strip comprising:
      an upper portion acting as a mandrel, wherein the upper portion is a remaining portion of the epitaxy semiconductor layer; and
      a lower portion under the mandrel, wherein the lower portion is a remaining portion of the semiconductor substrate;
   growing a first semiconductor fin starting from a first sidewall of the mandrel;
   growing a second semiconductor fin starting from a second sidewall of the mandrel, wherein the first sidewall and the second sidewall are opposite sidewalls of the mandrel;
   growing a dummy semiconductor layer on the first semiconductor fin, wherein the dummy semiconductor layer comprises a third sidewall contacting the first semiconductor fin to form a first interface, and a fourth sidewall contacting a dielectric region to form a second interface;
   forming a first transistor based on the first semiconductor fin; and
   forming a second transistor based on the second semiconductor fin.

2. The method of claim 1 further comprising removing the dummy semiconductor layer to leave a recess, wherein a replacement gate of the first transistor extends into the recess.

3. The method of claim 1, wherein the forming the first transistor comprises:
   forming a dummy gate stack on a portion of the first semiconductor fin;
   removing the dummy gate stack to expose the portion of the first semiconductor fin;
   etching an additional dielectric region directly underlying the portion of the first semiconductor fin; and
   forming a replacement gate stack encircling the portion of the first semiconductor fin.

4. The method of claim 1, wherein the dummy semiconductor layer and the first semiconductor fin are formed of different semiconductor materials, and the first interface and the second interface are vertical interfaces that are parallel to each other.

5. The method of claim 1, wherein the etching the epitaxy semiconductor layer and the semiconductor substrate further forms a first trench and a second trench on opposite sides of the semiconductor strip, and the method further comprises:
   forming a first isolation region and a second isolation region in the first trench and the second trench, respectively; and
   etching a first portion of the first isolation region and a second portion of the second isolation region to form recesses, wherein the first semiconductor fin and the second semiconductor fin are grown in the recesses.

6. The method of claim 1, wherein the forming the first transistor and the forming the second transistor comprise forming a common gate stack shared by the first transistor and the second transistor.

7. The method of claim 1, wherein the semiconductor substrate is a silicon substrate, and the forming the epitaxy semiconductor layer comprises epitaxially growing a silicon germanium layer.

8. A method comprising:
   performing a first epitaxy to grow a first semiconductor fin and a second semiconductor fin from a first sidewall and a second sidewall of a semiconductor mandrel;
   forming a dummy gate stack on a first portion of each of the first semiconductor fin and the second semiconductor fin;
   removing a second portion of each of the first semiconductor fin and the second semiconductor fin;
   oxidizing the semiconductor mandrel to form a dielectric fin;
   growing a first dummy semiconductor region and a second dummy semiconductor region in spaces left by the removed second portions of the first semiconductor fin and the second semiconductor fin, respectively;
   replacing the first dummy semiconductor region and the second dummy semiconductor region with a first source/drain region and a second source/drain region, respectively; and
   replacing the dummy gate stack with a replacement gate stack.

9. The method of claim 8 further comprising growing a first dummy semiconductor layer and a second dummy semiconductor layer on the first semiconductor fin and the second semiconductor fin, respectively, wherein the dummy gate stack is formed over the first dummy semiconductor layer and the second dummy semiconductor layer.

10. The method of claim 9 further comprising:
    before the removing the second portion of each of the first semiconductor fin and the second semiconductor fin, performing an etching process to remove the first dummy semiconductor layer and the second dummy semiconductor layer.

11. The method of claim 8 further comprising:
    epitaxially growing an epitaxy layer on a semiconductor substrate; and etching the epitaxy layer to form a first trench and a second trench, wherein a portion of the epitaxy layer between the first trench and the second trench forms the semiconductor mandrel.

12. The method of claim 11 further comprising:
forming a first isolation region and a second isolation region in the first trench and the second trench, respectively; and
etching a portion of each of the first isolation region and the second isolation region to reveal the first sidewall and the second sidewall of the semiconductor mandrel.

13. The method of claim 8, wherein the first source/drain region is of p-type, and the second source/drain region is of n-type.

14. The method of claim 8, wherein the replacement gate stack fully encircles the first portion of the first semiconductor fin.

15. A method comprising:
forming a protruding structure comprising a first semiconductor fin and a dielectric mask overlapping the first semiconductor fin;
growing a second semiconductor fin on a first sidewall of the first semiconductor fin, wherein a first top surface of the second semiconductor fin is lower than a second top surface of the dielectric mask, and wherein the second semiconductor fin comprises opposing edges parallel to each other;
forming a gate dielectric contacting the opposing edges of a first portion of the second semiconductor fin; and
forming a gate electrode on the gate dielectric, wherein the second semiconductor fin, the gate dielectric, and the gate electrode form parts of a first transistor.

16. The method of claim 15 further comprising oxidizing the first semiconductor fin to form a dielectric fin.

17. The method of claim 16 further comprising forming a source/drain region for the first transistor, wherein the source/drain region physically contacts the dielectric fin.

18. The method of claim 17, wherein a second sidewall of the source/drain region contacts the dielectric fin, and a third sidewall of the source/drain region contacts a dielectric region to form a vertical interface, and wherein the first sidewall and the second sidewall are opposing sidewalls of the source/drain region.

19. The method of claim 15, wherein the first semiconductor fin is grown in a trench, with the first semiconductor fin being on one side of the trench.

20. The method of claim 19, wherein the growing the second semiconductor fin is stopped before the trench is fully filled by the second semiconductor fin.

* * * * *